(12) United States Patent
Lin et al.

(10) Patent No.: US 10,062,663 B2
(45) Date of Patent: Aug. 28, 2018

(54) SEMICONDUCTOR ASSEMBLY WITH BUILT-IN STIFFENER AND INTEGRATED DUAL ROUTING CIRCUITRIES AND METHOD OF MAKING THE SAME

(71) Applicant: BRIDGE SEMICONDUCTOR CORPORATION, Taipei (TW)

(72) Inventors: Charles W. C. Lin, Singapore (SG); Chia-Chung Wang, Hsinchu County (TW)

(73) Assignee: BRIDGE SEMICONDUCTOR CORPORATION, Taipei (TW)

( * ) Notice: Subject to any disclaimer, the term of this patent is extended or adjusted under 35 U.S.C. 154(b) by 17 days.

(21) Appl. No.: 15/081,943

(22) Filed: Mar. 28, 2016

(65) Prior Publication Data

US 2016/0293514 A1    Oct. 6, 2016

Related U.S. Application Data

(60) Provisional application No. 62/141,428, filed on Apr. 1, 2015.

(51) Int. Cl.
*H01L 23/498* (2006.01)
*H01L 21/56* (2006.01)
(Continued)

(52) U.S. Cl.
CPC ........ *H01L 25/0655* (2013.01); *H01L 21/486* (2013.01); *H01L 21/561* (2013.01); *H01L 21/6835* (2013.01); *H01L 21/6836* (2013.01); *H01L 23/16* (2013.01); *H01L 23/3121* (2013.01); *H01L 23/367* (2013.01); *H01L 23/4334* (2013.01); *H01L 23/5389* (2013.01); *H01L 23/544* (2013.01); *H01L 24/19* (2013.01); *H01L 24/20* (2013.01); *H01L 24/83* (2013.01); *H01L 24/97* (2013.01); *H01L 25/50* (2013.01);
(Continued)

(58) Field of Classification Search
CPC ............. H01L 25/0655; H01L 21/6836; H01L 21/6835; H01L 23/367; H01L 21/486; H01L 23/5389; H01L 23/544; H01L 23/4334; H01L 24/19; H01L 24/20
USPC ........................................................ 257/707
See application file for complete search history.

(56) References Cited

U.S. PATENT DOCUMENTS 8,453,323 B2    6/2013    Sakamoto et al.
8,501,544 B2    8/2013    Pagaila
(Continued)

FOREIGN PATENT DOCUMENTS

CN    103596386 B    6/2016

*Primary Examiner* — Joseph C Nicely
*Assistant Examiner* — Thai T Vuong
(74) *Attorney, Agent, or Firm* — Pai Patent & Trademark Law Firm; Chao-Chang D Pai

(57) ABSTRACT

A semiconductor assembly with built-in stiffener and integrated dual routing circuitries is characterized in that a semiconductor device and a first routing circuitry are positioned within a through opening of a stiffener whereas a second routing circuitry extends to an area outside of the through opening of the stiffener. The mechanical robustness of the stiffener can prevent the assembly from warping. The first routing circuitry can enlarge the pad size and pitch of the semiconductor device, whereas the second routing circuitry not only provides further fan-out wiring structure, but also mechanically binds the first routing circuitry with the stiffener.

4 Claims, 23 Drawing Sheets

(51) Int. Cl.
*H01L 21/48* (2006.01)
*H01L 23/48* (2006.01)
*H01L 25/065* (2006.01)
*H01L 23/31* (2006.01)
*H01L 23/16* (2006.01)
*H01L 25/00* (2006.01)
*H01L 23/367* (2006.01)
*H01L 23/433* (2006.01)
*H01L 23/538* (2006.01)
*H01L 23/544* (2006.01)
*H01L 21/683* (2006.01)
*H01L 23/00* (2006.01)
*H01L 23/373* (2006.01)
*H01L 23/42* (2006.01)

(52) U.S. Cl.
CPC .......... *H01L 21/568* (2013.01); *H01L 23/373* (2013.01); *H01L 23/3731* (2013.01); *H01L 23/3735* (2013.01); *H01L 23/3736* (2013.01); *H01L 23/42* (2013.01); *H01L 24/16* (2013.01); *H01L 24/32* (2013.01); *H01L 24/73* (2013.01); *H01L 24/81* (2013.01); *H01L 24/92* (2013.01); *H01L 2221/68318* (2013.01); *H01L 2221/68359* (2013.01); *H01L 2221/68372* (2013.01); *H01L 2221/68386* (2013.01); *H01L 2223/54426* (2013.01); *H01L 2223/54486* (2013.01); *H01L 2224/04105* (2013.01); *H01L 2224/16227* (2013.01); *H01L 2224/16235* (2013.01); *H01L 2224/26175* (2013.01); *H01L 2224/32225* (2013.01); *H01L 2224/32245* (2013.01); *H01L 2224/73253* (2013.01); *H01L 2224/73267* (2013.01); *H01L 2224/81005* (2013.01); *H01L 2224/81203* (2013.01); *H01L 2224/81207* (2013.01); *H01L 2224/81815* (2013.01); *H01L 2224/83005* (2013.01); *H01L 2224/8314* (2013.01); *H01L 2224/92225* (2013.01); *H01L 2224/92244* (2013.01); *H01L 2224/97* (2013.01); *H01L 2924/15313* (2013.01); *H01L 2924/3025* (2013.01); *H01L 2924/3511* (2013.01)

(56) References Cited

U.S. PATENT DOCUMENTS

| | | | |
|---|---|---|---|
| 8,525,337 | B2 | 9/2013 | Pendse |
| 8,536,715 | B2 | 9/2013 | Chino |
| 8,618,652 | B2 | 12/2013 | Nalla et al. |
| 8,836,114 | B2 | 9/2014 | Oh et al. |
| 2009/0152688 | A1* | 6/2009 | Do .................. H01L 23/552 257/659 |
| 2009/0294941 | A1* | 12/2009 | Oh .................. H01L 23/367 257/686 |
| 2010/0025081 | A1 | 2/2010 | Arai et al. |
| 2011/0089573 | A1 | 4/2011 | Kurita |
| 2011/0233757 | A1 | 9/2011 | O'Neill |
| 2013/0032938 | A1* | 2/2013 | Lin .................. H01L 23/3121 257/737 |
| 2013/0056863 | A1* | 3/2013 | Chi .................. H01L 23/16 257/704 |
| 2013/0075889 | A1* | 3/2013 | Pagaila .................. H01L 23/552 257/713 |
| 2013/0337648 | A1* | 12/2013 | Lin .................. H01L 21/486 438/675 |

\* cited by examiner

SEMICONDUCTOR ASSEMBLY WITH BUILT-IN STIFFENER AND INTEGRATED DUAL ROUTING CIRCUITRIES AND METHOD OF MAKING THE SAME

CROSS REFERENCE TO RELATED APPLICATIONS

This application claims the benefit of filing date of U.S. Provisional Application Ser. No. 62/141,428 filed Apr. 1, 2015. The entirety of said Provisional Application is incorporated herein by reference.

FIELD OF THE INVENTION

The present invention relates to a semiconductor assembly and, more particularly, to a semiconductor assembly having a semiconductor device interconnected to integrated dual routing circuitries located within and outside a through opening of a stiffener, respectively, and a method of making the same.

DESCRIPTION OF RELATED ART

Market trends of multimedia devices demand for faster and slimmer designs. One of the approaches is to embed an electronic device in a wiring board so that a thinner, smaller assembly with better electrical performance can be achieved. U.S. Pat. Nos. 8,453,323, 8,525,337, 8,618,652 and 8,836,114 disclose various wiring boards having an embedded device for such kind of purpose. However, in addition to poor warping control, it is extremely difficult to embed an electronic device in a wiring board without suffering high yield loss. This is because minor dislocation of the embedded device due to placement accuracy or adhesive curing dislocation may lead to I/O disconnection, device failure and low manufacturing yield as described in U.S. Pat. Nos. 8,536,715 and 8,501,544.

For the reasons stated above, and for other reasons stated below, an urgent need exists to develop a new assembly having embedded electronic component that can address ultra-high packaging density, high signal integrity, low profile and low warpage.

SUMMARY OF THE INVENTION

A primary objective of the present invention is to provide a semiconductor assembly in which a semiconductor device and a first fan-out routing circuitry are positioned within a through opening of a stiffener so that the dislocation, central area warping and bending of the assembly can be suppressed, thereby improving production yield and device-level reliability.

Another objective of the present invention is to provide a semiconductor assembly wherein a second fan-out routing circuitry extends into an area outside of the through opening of the stiffener so that the outmost area warping and bending of the assembly can be well controlled, thereby improving board-level assembly reliability.

In accordance with the foregoing and other objectives, the present invention provides a semiconductor assembly that includes a semiconductor device, a balance layer, a first routing circuitry, a stiffener and a second routing circuitry. In a preferred embodiment, the stiffener, having a through opening, provides a high modulus anti-warping platform for the semiconductor device and the integrated dual routing circuitries; the first routing circuitry, positioned within the through opening of the stiffener, provides primary fan-out routing for the semiconductor device so that the pad size and pitch of the semiconductor device can be enlarged before proceeding the subsequent formation of the second routing circuitry; and the second routing circuitry, laterally extending over the stiffener and electrically connected to the first routing circuitry, mechanically binds the first routing circuitry with the stiffener and provides further fan-out routing and has pad pith and size that match the next level assembly. Additionally, the semiconductor assembly of the present invention may further includes a heat spreader that is located within the through opening of the stiffener and attached to an inactive surface of the semiconductor device to provide a thermal dissipation pathway for the semiconductor device.

In another aspect, the present invention provides a semiconductor assembly with built-in stiffener and integrated dual routing circuitries, comprising: a subassembly that includes a semiconductor device, a balance layer and a first routing circuitry, wherein (i) the semiconductor device is electrically coupled to the first routing circuitry from a first surface of the first routing circuitry, (ii) the first routing circuitry includes at least one conductive trace laterally extending beyond peripheral edges of the semiconductor device, and (iii) the balance layer laterally surrounds the semiconductor device and covers the first surface of the first routing circuitry; a stiffener having a through opening that extends through the stiffener, wherein the subassembly is positioned within the through opening of the stiffener; and a second routing circuitry that is electrically coupled to the first routing circuitry from an opposite second surface of the first routing circuitry and includes at least one conductive trace laterally extending beyond peripheral edges of the first routing circuitry and over a surface of stiffener.

In yet another aspect, the present invention provides a method of making a semiconductor assembly with built-in stiffener and integrated dual routing circuitries, comprising steps of: providing a subassembly that includes (i) providing a first routing circuitry detachably adhered over a sacrificial carrier, (ii) electrically coupling a semiconductor device to the first routing circuitry from a first surface of the first routing circuitry, (iii) providing a balance layer that laterally surrounds the semiconductor device and covers the first surface of the first routing circuitry, and (iv) removing the sacrificial carrier to expose an opposite second surface of the first routing circuitry; providing a stiffener that has a through opening extending through the stiffener; inserting the subassembly into the through opening of the stiffener, with the second surface of the first routing circuitry exposed from the through opening of the stiffener; and forming a second routing circuitry that is electrically coupled to the first routing circuitry from the second surface of the first routing circuitry and includes at least one conductive trace laterally extending beyond peripheral edges of the first routing circuitry and over a surface of the stiffener.

In yet another aspect, the present invention provides another method of making a semiconductor assembly with built-in stiffener and integrated dual routing circuitries, comprising steps of: providing a subassembly that includes (i) attaching a semiconductor device to a heat spreader using a thermally conductive material, (ii) providing a balance layer that laterally surrounds the semiconductor device, and (iii) forming a first routing circuitry over the semiconductor device and the balance layer, with the semiconductor device electrically coupled to the first routing circuitry from a first surface of the first routing circuitry, wherein the first routing circuitry includes at least one conductive trace laterally extending beyond peripheral edges of the semiconductor device; providing a stiffener that has a through opening extending through the stiffener; inserting the subassembly into the through opening of the stiffener, with an opposite second surface of the first routing circuitry exposed from the through opening of the stiffener; and forming a second routing circuitry that is electrically coupled to the first routing circuitry from the second surface of the first routing circuitry and includes at least one conductive trace laterally extending beyond peripheral edges of the first routing circuitry and over a surface of the stiffener.

Unless specifically indicated or using the term "then" between steps, or steps necessarily occurring in a certain order, the sequence of the above-mentioned steps is not limited to that set forth above and may be changed or reordered according to desired design.

The method of making a semiconductor assembly according to the present invention has numerous advantages. For instance, inserting the subassembly into the through opening of the stiffener before the formation of the second routing circuitry is particularly advantageous as the balance layer and the optional heat spreader of the subassembly together with the stiffener can provide a stable platform for forming the second routing circuitry and micro-via connection failure in the subsequent formation of the second routing circuitry can be avoided. Additionally, the two-stage formation of the interconnect substrate for the semiconductor device is beneficial as the first routing circuitry can provide primary fan-out routing whereas the second routing circuitry provides further fan-out routing and horizontal interconnections, and serious warping problem can be avoided when multiple layers of routing circuitries are need.

These and other features and advantages of the present invention will be further described and more readily apparent from the detailed description of the preferred embodiments which follows.

BRIEF DESCRIPTION OF THE DRAWINGS

The following detailed description of the preferred embodiments of the present invention can best be understood when read in conjunction with the following drawings, in which.

DETAILED DESCRIPTION OF THE PREFERRED EMBODIMENTS

Figure 1:
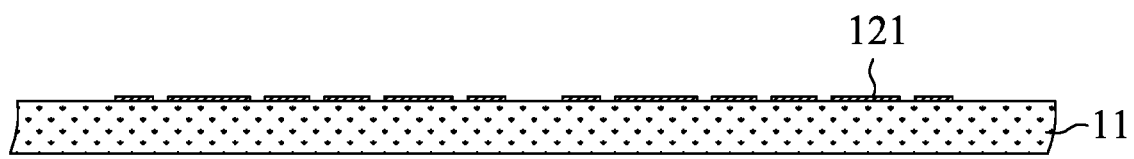
FIGS. 1 and 2 are cross-sectional and top perspective views, respectively, showing that primary conductive traces are deposited on a sacrificial carrier in accordance with the first embodiment of the present invention.

Hereafter, examples will be provided to illustrate the embodiments of the present invention. Advantages and effects of the invention will become more apparent from the following description of the present invention. It should be noted that these accompanying figures are simplified and illustrative. The quantity, shape and size of components shown in the figures may be modified according to practical conditions, and the arrangement of components may be more complex. Other various aspects also may be practiced or applied in the invention, and various modifications and variations can be made without departing from the spirit of the invention based on various concepts and applications.

Embodiment 1

FIGS. 1-26 are schematic views showing a method of making a semiconductor assembly that includes a first routing circuitry 12, semiconductor devices 13, a balance layer 17, a heat spreader 18, a stiffener 20 and a second routing circuitry 40 in accordance with the first embodiment of the present invention.

Figure 2:
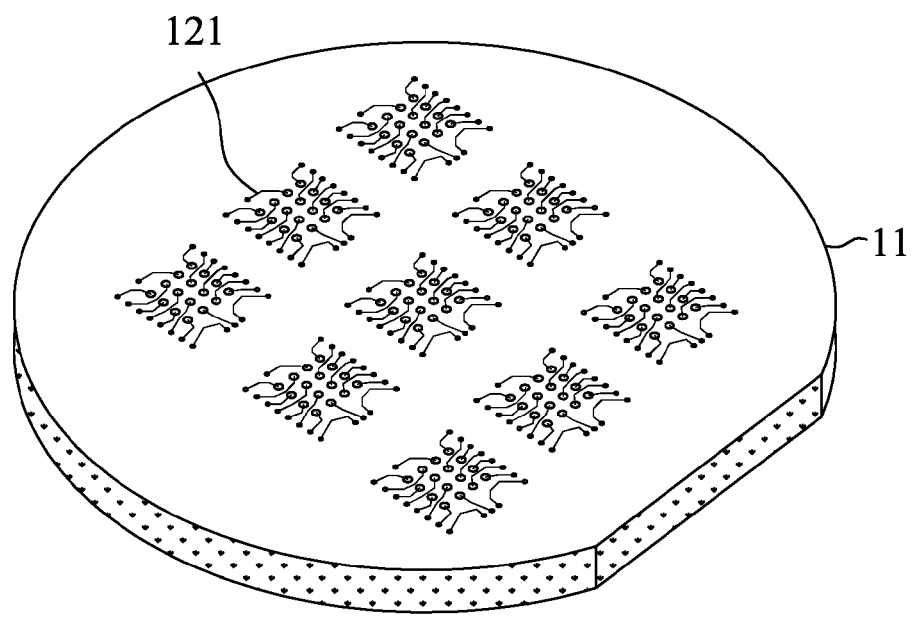

FIGS. 1 and 2 are cross-sectional and top perspective views, respectively, of the structure with primary conductive traces 121 formed on a sacrificial carrier 11 by metal deposition and metal patterning process. In this illustration, the sacrificial carrier 11 is a single-layer structure. The sacrificial carrier 11 typically is made of copper, aluminum, iron, nickel, tin, stainless steel, silicon, or other metals or alloys, but any other conductive or non-conductive material also may be used. In this embodiment, the sacrificial carrier 11 is made of an iron-based material. The primary conductive traces 121 typically are made of copper and can be pattern deposited by numerous techniques, such as electroplating, electroless plating, evaporating, sputtering or their combinations, or be thin-film deposited followed by a metal patterning process. For a conductive sacrificial carrier 11, the primary conductive traces 121 are deposited typically by plating of metal. The metal patterning techniques include wet etching, electro-chemical etching, laser-assist etching, and their combinations with an etch mask (not shown) thereon that defines the primary conductive traces 121.

Figure 3:
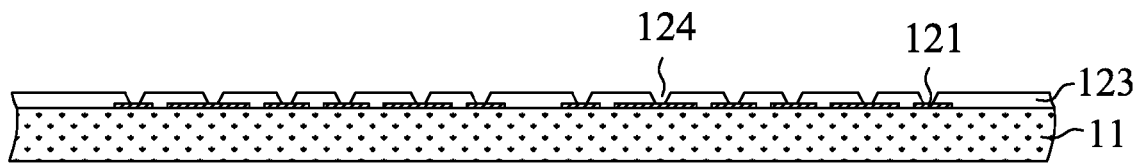
FIG. 3 is a cross-sectional view showing that the structure of FIG. 1 is provided with a first dielectric layer and first via openings in accordance with the first embodiment of the present invention.

FIG. 3 is a cross-sectional view of the structure with a first dielectric layer 123 on the sacrificial carrier 11 as well as the primary conductive traces 121 and first via openings 124 in the first dielectric layer 123. The first dielectric layer 123 is deposited typically by lamination or coating, and contacts and covers and extends laterally on the sacrificial carrier 11 and the primary conductive traces 121 from above. The first dielectric layer 123 typically has a thickness of 50 microns, and can be made of epoxy resin, glass-epoxy, polyimide, or the like. After the deposition of the first dielectric layer 123, the first via openings 124 are formed by numerous techniques including laser drilling, plasma etching and photolithography, and typically have a diameter of 50 microns. Laser drilling can be enhanced by a pulsed laser. Alternatively, a scanning laser beam with a metal mask can be used. The first via openings 124 extend through the first dielectric layer 123 and are aligned with selected portions of the primary conductive traces 121.

Figure 4:
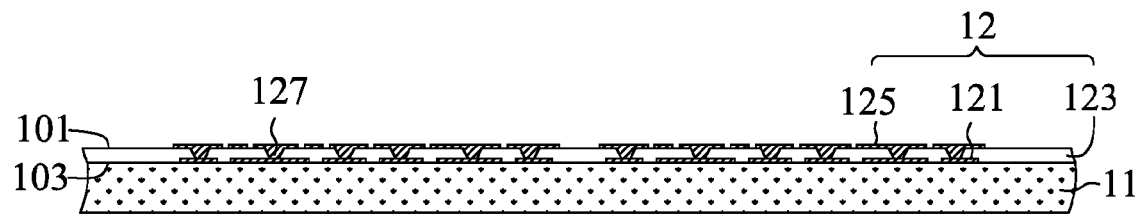
FIGS. 4 and 5 are cross-sectional and top perspective views, respectively, showing that the structure of FIG. 3 is provided with first conductive traces in accordance with the first embodiment of the present invention.
Figure 5:
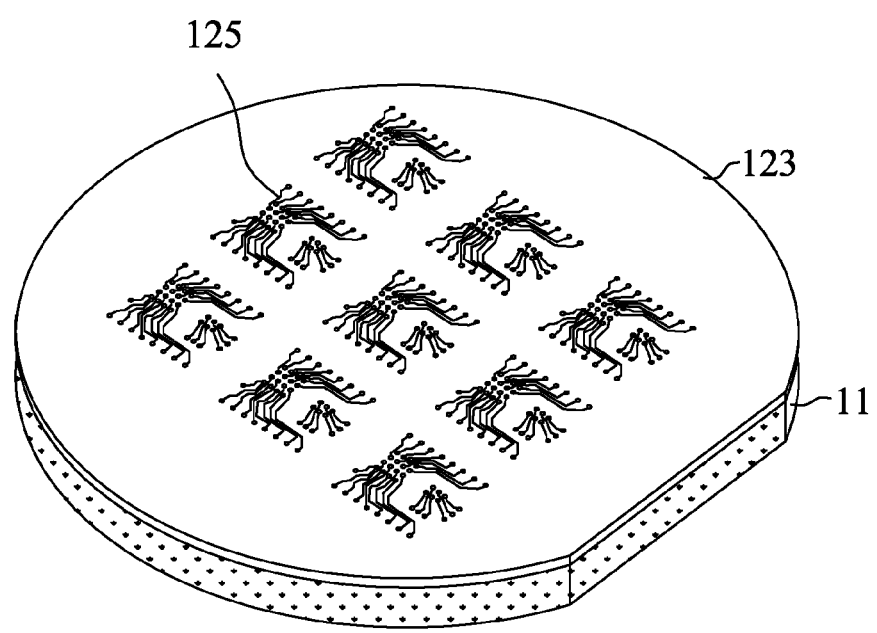

FIGS. 4 and 5 are cross-sectional and top perspective views, respectively, of the structure provided with first conductive traces 125 on the first dielectric layer 123 by metal deposition and metal patterning process. The first conductive traces 125 extend from the primary conductive traces 121 in the upward direction, fill up the first via openings 124 to form first conductive vias 127 in direct contact with the primary conductive traces 121, and extend laterally on the first dielectric layer 123. As a result, the first conductive traces 125 can provide horizontal signal routing in both the X and Y directions and vertical routing through the first via openings 124 and serve as electrical connections for the primary conductive traces 121.

The first conductive traces 125 can be deposited as a single layer or multiple layers by any of numerous techniques, such as electroplating, electroless plating, evaporating, sputtering, or their combinations. For instance, they can be deposited by first dipping the structure in an activator solution to render the first dielectric layer 123 catalytic to electroless copper, and then a thin copper layer is electrolessly plated to serve as the seeding layer before a second copper layer is electroplated on the seeding layer to a desirable thickness. Alternatively, the seeding layer can be formed by sputtering a thin film such as titanium/copper before depositing the electroplated copper layer on the seeding layer. Once the desired thickness is achieved, the plated layer can be patterned to form the first conductive traces 125 by any of numerous techniques including wet etching, electro-chemical etching, laser-assist etching, and their combinations, with an etch mask (not shown) thereon that defines the first conductive traces 125.

At this stage, the formation of a first routing circuitry 12 on the sacrificial carrier 11 is accomplished. In this illustration, the first routing circuitry 12 includes primary conductive traces 121, a first dielectric layer 123 and first conductive traces 125. The primary conductive traces 121 have larger pad size and pad pitch than those of the first conductive traces 125. As a result, the first routing circuitry 12 can provide electrical contacts at its first surface 101 for chip connection and at its second surface 103 for next level routing circuitry connection.

Figure 6:
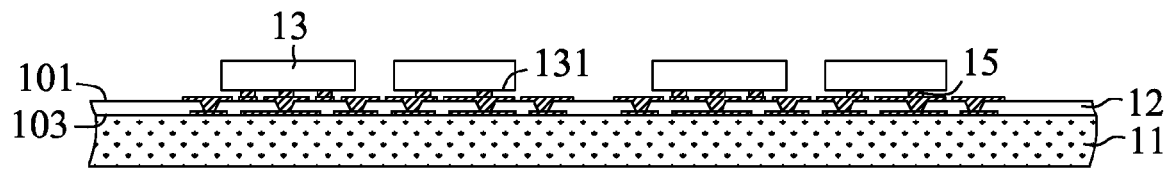
FIGS. 6 and 7 are cross-sectional and top perspective views, respectively, showing that semiconductor devices are electrically coupled to the structure of FIGS. 4 and 5 in accordance with the first embodiment of the present invention.
Figure 7:
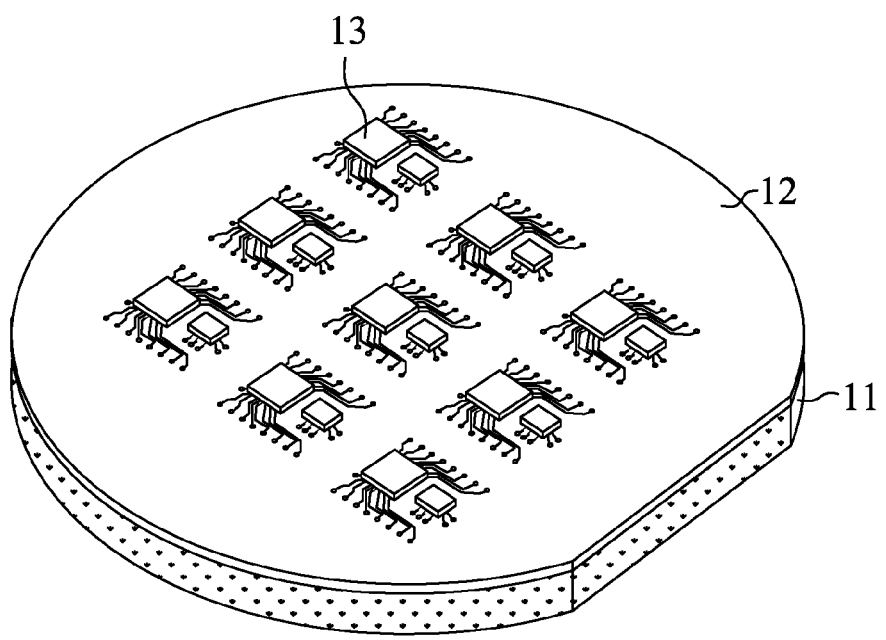

FIGS. 6 and 7 are cross-sectional and top perspective views, respectively, of the structure with the semiconductor devices 13 electrically coupled to the first routing circuitry 12 from the first surface 101 of the first routing circuitry 12. The semiconductor devices 13, illustrated as bare chips, have an active surface 131 facing the first routing circuitry 12, and can be electrically coupled to the first routing circuitry 12 using bumps 15 by thermal compression, solder reflow or thermosonic bonding.

Figure 8:
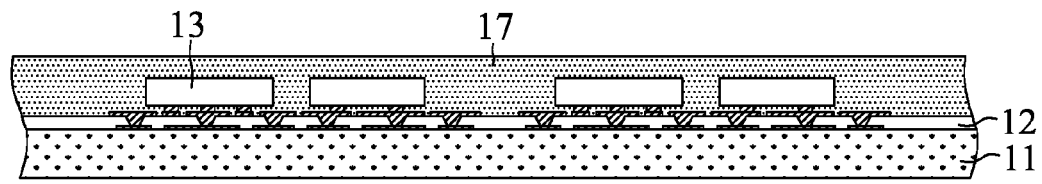
FIG. 8 is a cross-sectional view showing that the structure of FIG. 6 is provided with a balance layer in accordance with the first embodiment of the present invention.

FIG. 8 is a cross-sectional view of the structure with a balance layer 17 on the semiconductor devices 13 and the first routing circuitry 12 by, for example, resin-glass lamination, resin-glass coating or molding. The balance layer 17 covers the semiconductor devices 13 and the first routing circuitry 12 from above and surrounds and conformally coats and covers sidewalls of the semiconductor devices 13.

Figure 9:
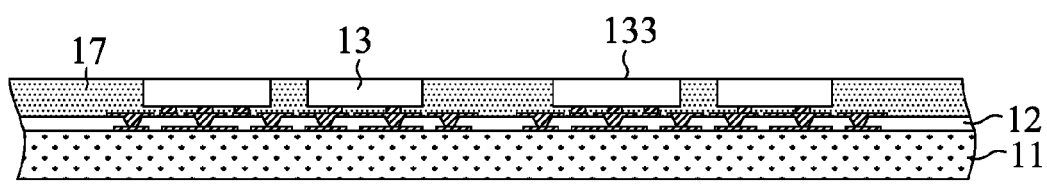
FIG. 9 is a cross-sectional view showing that a top portion of the balance layer is removed from the structure of FIG. 8 in accordance with the first embodiment of the present invention.

FIG. 9 is a cross-sectional view of the structure with the inactive surface 133 of the semiconductor devices 13 exposed from above. The upper portion of the balance layer 17 can be removed by grinding. After grinding, the balance layer 17 has a top surface substantially coplanar with the inactive surface 133 of the semiconductor devices 13.

Figure 10:
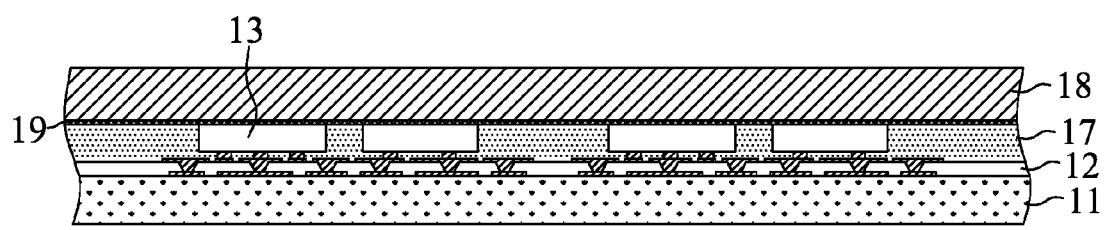
FIG. 10 is a cross-sectional view showing that the structure of FIG. 9 is provided with a heat spreader in accordance with the first embodiment of the present invention.

FIG. 10 is a cross-sectional view of the structure with a heat spreader 18 attached to the semiconductor devices 13. The heat spreader 18 can be made of any material with high thermal conductivity, such as metal, alloy, silicon, ceramic or graphite. The heat spreader 18 is attached on the inactive surface 133 of the semiconductor devices 13 and the top surface of the balance layer 17 using a thermally conductive material 19 (typically thermally conductive adhesive).

Figure 11:
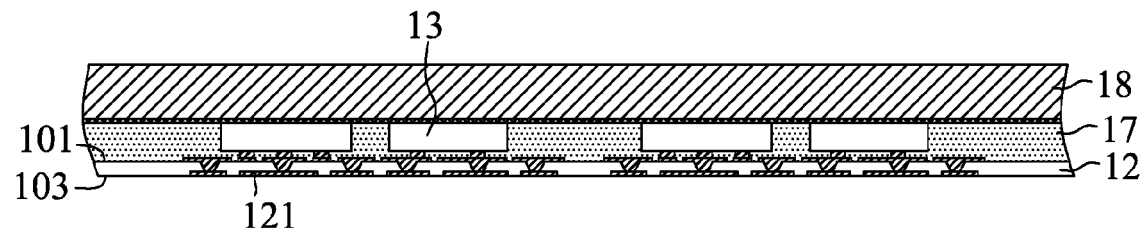
FIG. 11 is a cross-sectional view showing that the sacrificial carrier is removed from the structure of FIG. 10 in accordance with the first embodiment of the present invention.

FIG. 11 is a cross-sectional view of the structure after removal of the sacrificial carrier 11 to expose the second surface 103 of the first routing circuitry 12. The sacrificial carrier 11 can be removed by numerous techniques including wet chemical etching using acidic solution (e.g., ferric chloride, copper sulfate solutions), or alkaline solution (e.g., ammonia solution), electro-chemical etching, or mechanical process such as a drill or end mill followed by chemical etching. In this embodiment, the sacrificial carrier 11 made of an iron-based material is removed by a chemical etching solution that is selective between copper and iron so as to prevent the primary conductive traces 121 made of copper from being etched during removal of the sacrificial carrier 11.

Figure 12:
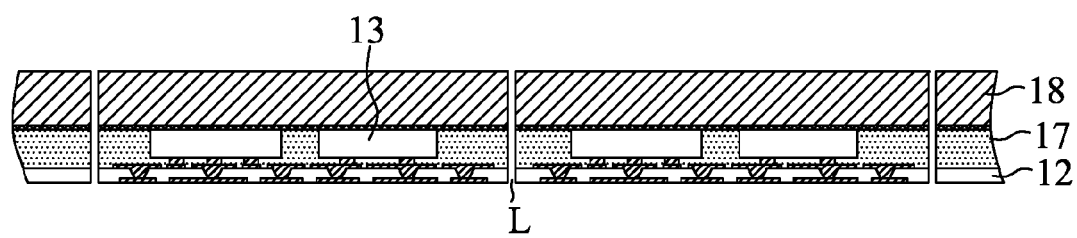
FIGS. 12 and 13 are cross-sectional and bottom perspective views, respectively, of a diced state of the panel-scale structure of FIG. 11 in accordance with the first embodiment of the present invention.
Figure 13:
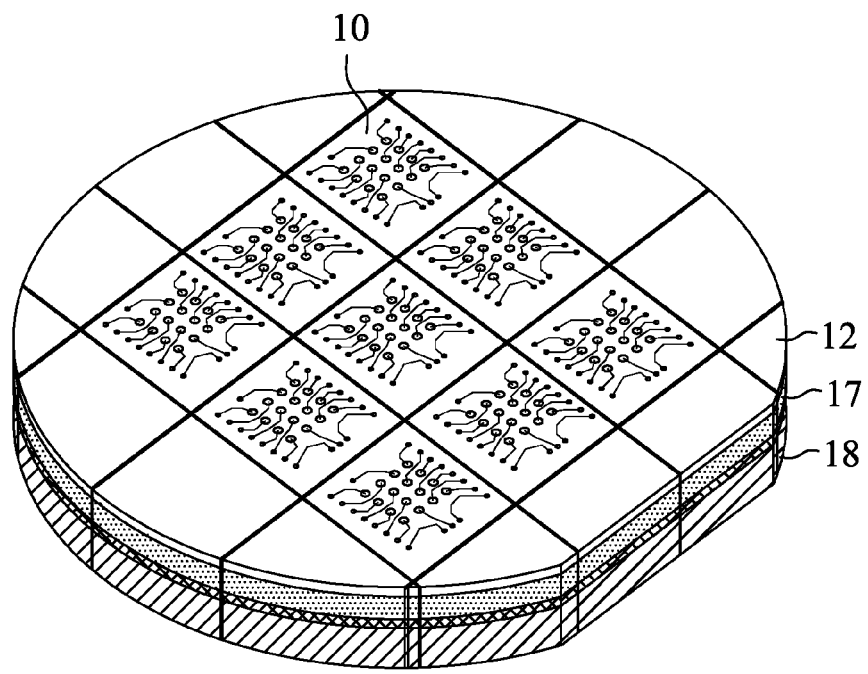

FIGS. 12 and 13 are cross-sectional and bottom perspective views, respectively, of the panel-scale structure of FIG. 11 diced into individual pieces. The panel-scale structure is singulated into individual subassembly 10 along dicing lines "L".

Figure 14:
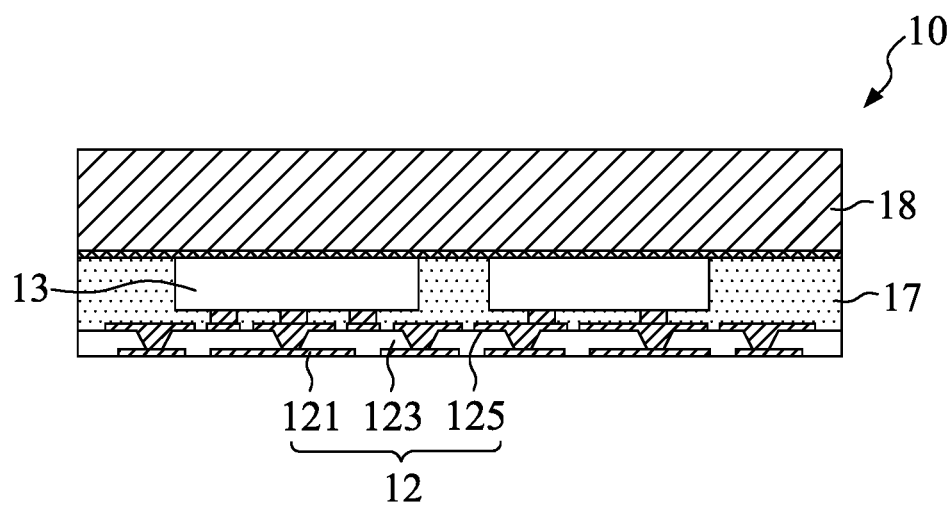
FIGS. 14 and 15 are cross-sectional and bottom perspective views, respectively, of a subassembly corresponding to a diced unit in FIGS. 12 and 13 in accordance with the first embodiment of the present invention.
Figure 15:
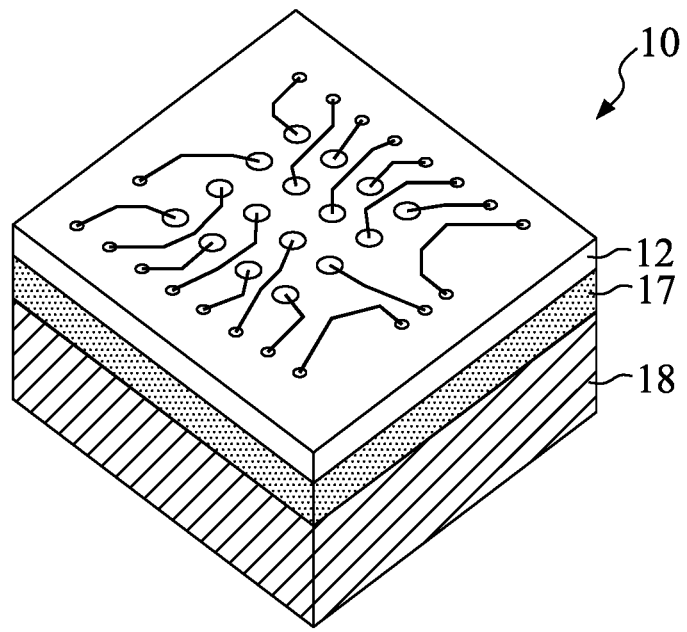

FIGS. 14 and 15 are cross-sectional and bottom perspective views, respectively, of an individual subassembly 10 that includes a first routing circuitry 12, semiconductor devices 13, a balance layer 17 and a heat spreader 18. In this illustration, the first routing circuitry 12 is a multi-layered buildup circuitry that includes primary conductive traces 121 and first conductive traces 125 laterally extending beyond peripheral edges of the semiconductor devices 13.

Figure 16:
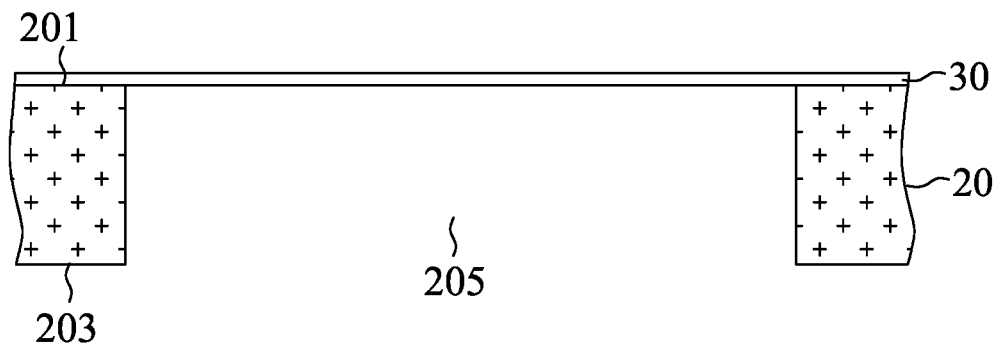
FIG. 16 is a cross-sectional view of a stiffener attached to a carrier film in accordance with the first embodiment of the present invention.

FIG. 16 is a cross-sectional view of a stiffener 20 attached to a carrier film 30. The stiffener 20 has a first surface 201, an opposite second surface 203, and a through opening 205 that extends through the stiffener 20 between the first surface 201 and the second surface 203. The stiffener 20 can be made of metal, composites of metal, ceramic, resin or other non-metallic materials, and may be a single or multi-layer circuitry structure which has enough mechanical robustness. The stiffener 20 having the through opening 205 can be fabricated by casting, forging, plating, stamping, machining, molding, combinations thereof or other techniques. The stiffener 20 preferably has a thickness substantially the same as that of the subassembly 10, and the through opening 205 has a dimension that is substantially the same as or slightly larger than the subassembly 10. The carrier film 30 typically is a tape, and the first surface 201 of the stiffener 20 is attached to the carrier film 30 by the adhesive property of the carrier film 30.

Figure 17:
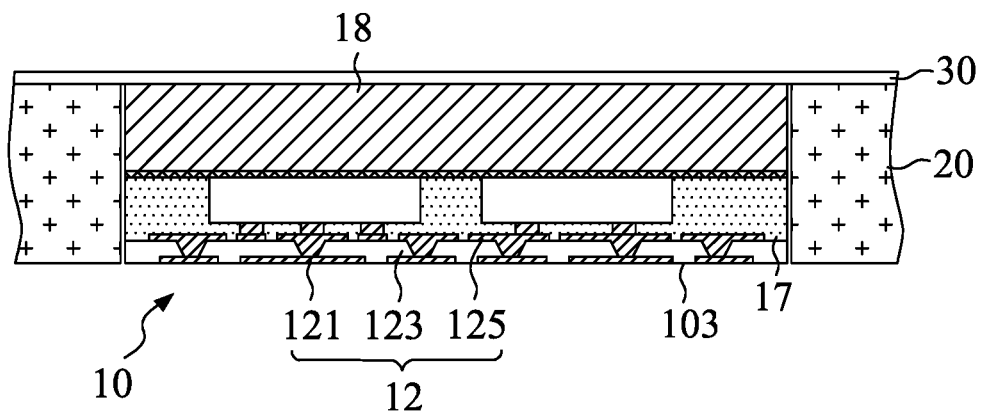
FIGS. 17 and 18 are cross-sectional and bottom perspective views, respectively, showing that the subassembly of FIG. 14 is attached to the carrier film of FIG. 16 in accordance with the first embodiment of the present invention.
Figure 18:
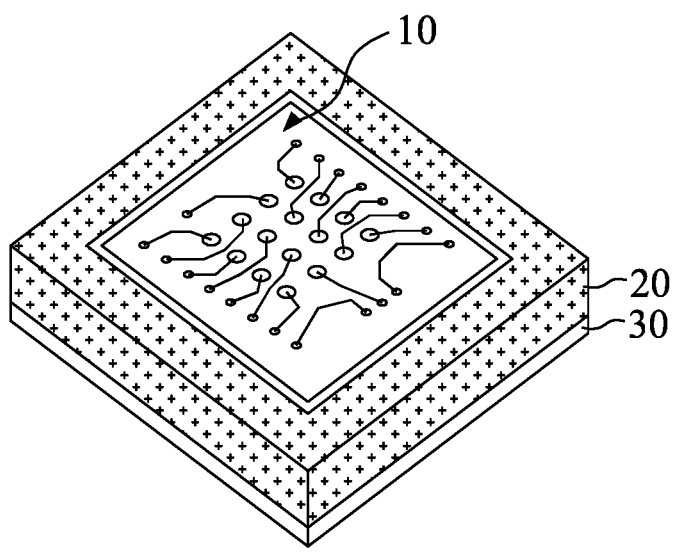

FIGS. 17 and 18 are cross-sectional and bottom perspective views, respectively, of the structure with the subassembly 10 inserted in the through opening 205 of the stiffener 20 with the heat spreader 18 attached to the carrier film 30. The carrier film 30 can provide temporary retention force for the subassembly 10 steadily residing within the through opening 205. The peripheral edges of the first routing circuitry 12, the balance layer 17 and the heat spreader 18 are in close proximity to sidewalls of the through opening 205 of the stiffener 20. In this illustration, the subassembly 10 is attached to the carrier film 30 by the adhesive property of the carrier film 30. Alternatively, the subassembly 10 may be attached to the carrier film 30 by dispensing extra adhesive. After the insertion of the subassembly 10 into the through opening 205, the second surface 103 of the first routing circuitry 12 is substantially coplanar with the second surface 203 of the stiffener 20 in the downward direction. In the case of the through opening 205 having a slightly larger area than the subassembly 10, an adhesive (not shown in the figure) may be optionally dispensed in a gap formed in the through opening 205 between the subassembly 10 and the stiffener 20 to provide secure robust mechanical bonds between the subassembly 10 and the stiffener 20.

Figure 19:
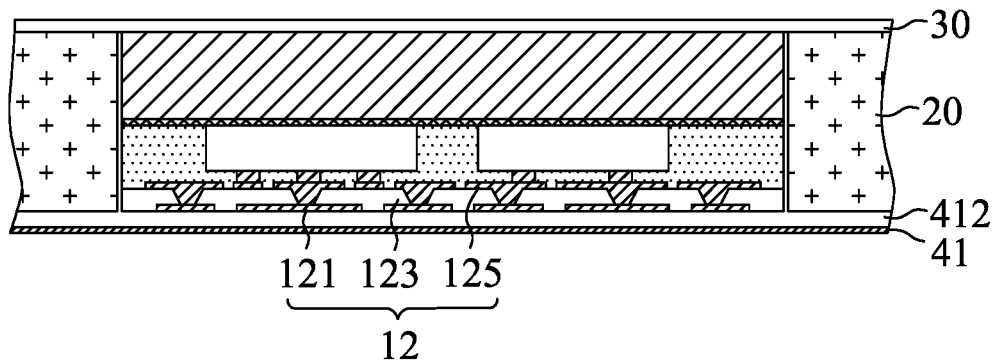
FIG. 19 is a cross-sectional view showing that the structure of FIG. 17 is provided with a second dielectric layer and a metal layer in accordance with the first embodiment of the present invention.

FIG. 19 is a cross-sectional view of the structure with a second dielectric layer 412 and a metal layer 41 laminated/coated on the subassembly 10 and the stiffener 20 from below. The second dielectric layer 412 contacts and is sandwiched between the first dielectric layer 123/the primary conductive traces 121 and the metal layer 41 and between the stiffener 20 and the metal layer 41. The second dielectric layer 412 can be formed of epoxy resin, glass-epoxy, polyimide, and the like, and typically has a thickness of 50 microns. The metal layer 41 typically is a copper layer with a thickness of 25 microns.

Figure 20:
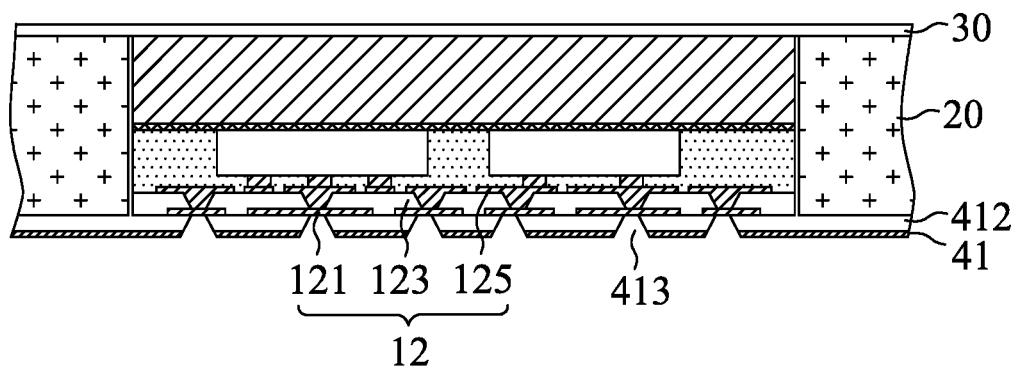
FIG. 20 is a cross-sectional view showing that the structure of FIG. 19 is provided with second via openings in accordance with the first embodiment of the present invention.

FIG. 20 is a cross-sectional view of the structure provided with the second via openings 413 to expose selected portion of the primary conductive traces 121. The second via openings 413 extend through the metal layer 41 and the second dielectric layer 412, and are aligned with the selected portions of the primary conductive traces 121. Like the first via openings 124, the second via openings 413 can be formed by any of numerous techniques, such as laser drilling, plasma etching and photolithography and typically have a diameter of 50 microns.

Figure 21:
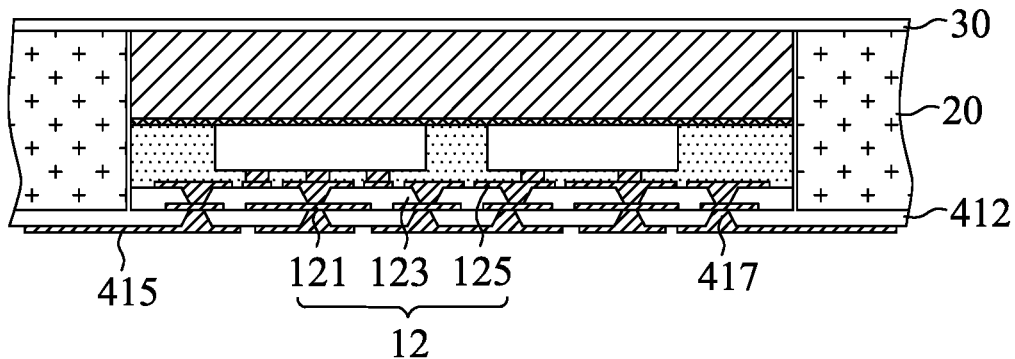
FIG. 21 is a cross-sectional view showing that the structure of FIG. 20 is provided with second conductive traces in accordance with the first embodiment of the present invention.

Referring now to FIG. 21, second conductive traces 415 are formed on the second dielectric layer 412 by metal deposition and metal patterning process. The second conductive traces 415 extend from the primary conductive traces 121 in the downward direction, fill up the second via openings 413 to form second conductive vias 417 in direct contact with the primary conductive traces 121, and extend laterally on the second dielectric layer 412.

Figure 22:
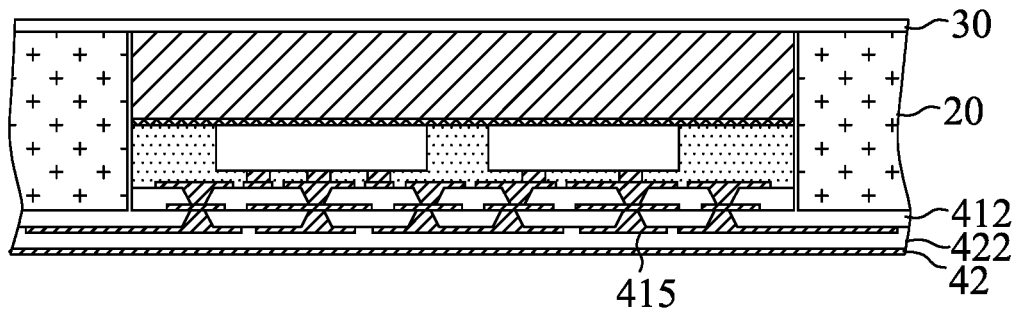
FIG. 22 is a cross-sectional view showing that the structure of FIG. 21 is provided with a third dielectric layer and a metal layer in accordance with the first embodiment of the present invention.

FIG. 22 is a cross-sectional view of the structure with a third dielectric layer 422 and a metal layer 42 laminated/coated on the second dielectric layer 412 and the second conductive traces 415 from below. The third dielectric layer 422 contacts and is sandwiched between the second dielectric layer 412/the second conductive traces 415 and the metal layer 42. The third dielectric layer 422 can be formed of epoxy resin, glass-epoxy, polyimide, or the like, and typically has a thickness of 50 microns. The metal layer 42 typically is a copper layer with a thickness of 25 microns.

Figure 23:
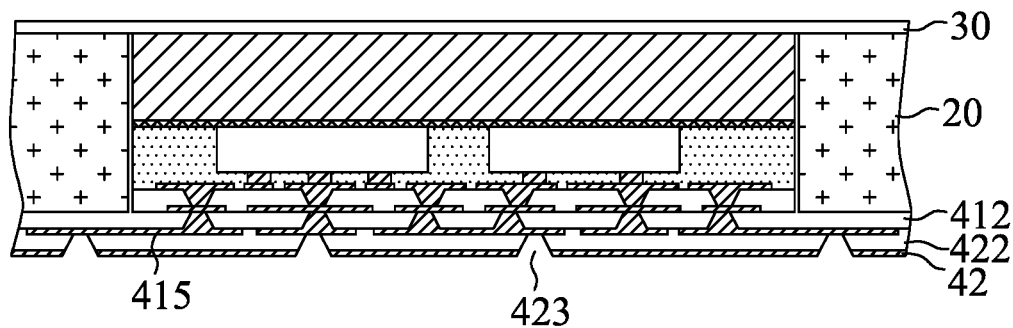
FIG. 23 is a cross-sectional view showing that the structure of FIG. 22 is provided with third via openings in accordance with the first embodiment of the present invention.

FIG. 23 is a cross-sectional view of the structure provided with the third via openings 423 to expose selected portions of the second conductive traces 415. The third via openings 423 extend through the metal layer 42 and the third dielectric layer 422, and are aligned with the selected portions of the second conductive traces 415. Like the first and second via openings 124, 413, the third via openings 423 can be formed by any of numerous techniques, such as laser drilling, plasma etching and photolithography and typically have a diameter of 50 microns.

Figure 24:
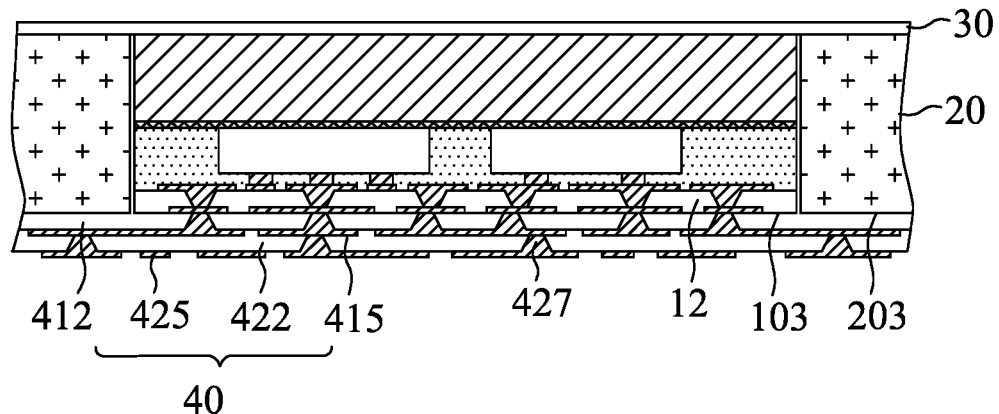
FIG. 24 is a cross-sectional view showing that the structure of FIG. 23 is provided with third conductive traces in accordance with the first embodiment of the present invention.

FIG. 24 is a cross-sectional view of the structure provided with third conductive traces 425 on the third dielectric layer 422 by metal deposition and metal patterning process. The third conductive traces 425 extend from the second conductive traces 415 in the downward direction, fill up the third via openings 423 to form third conductive vias 427 in direct contact with the second conductive traces 415, and extend laterally on the third dielectric layer 422.

At this stage, the formation of a second routing circuitry 40 on the second surface 103 of the first routing circuitry 12 and the second surface 203 of the stiffener 20 is accomplished. In this illustration, the second routing circuitry 40 includes a second dielectric layer 412, second conductive traces 415, a third dielectric layer 422 and third conductive traces 425. The second routing circuitry 40 contacts and laterally extends on the first dielectric layer 123/the primary conductive traces 121 of the first routing circuitry 12 and the stiffener 20, and laterally extends beyond peripheral edges of the first routing circuitry 12. As such, the surface area of the second routing circuitry 40 is larger than that of the first routing circuitry 12. Specifically, the second routing circuitry 40 substantially has a combined surface area of the first routing circuitry 12 and the stiffener 20.

Figure 25:
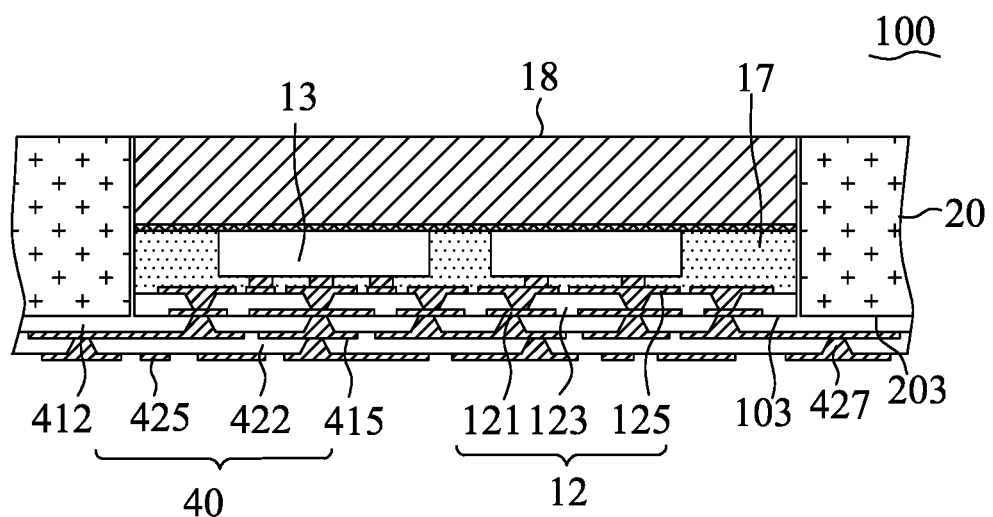
FIGS. 25 and 26 are cross-sectional and bottom perspective views, respectively, showing that the carrier film is removed from the structure of FIG. 24 to finish the fabrication of a semiconductor assembly in accordance with the first embodiment of the present invention.
Figure 26:
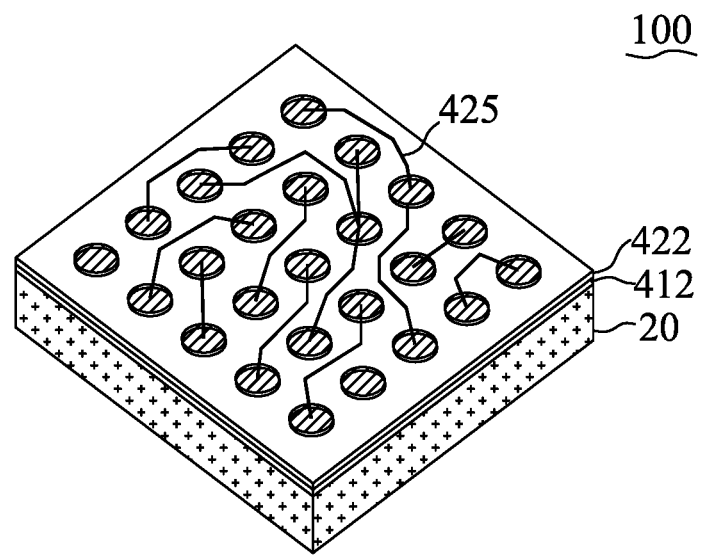

FIGS. 25 and 26 are cross-sectional and bottom perspective views, respectively, of the structure after removal of the carrier film 30. The carrier film 30 is detached from the heat spreader 18 and the stiffener 20 to expose the heat spreader 18 from above.

Accordingly, as shown in FIGS. 25 and 26, a semiconductor assembly 100 is accomplished and includes a first routing circuitry 12, semiconductor devices 13, a balance layer 17, a heat spreader 18, a stiffener 20 and a second routing circuitry 40, and both first and second routing circuitries 12, 40 are sequentially formed multi-layered buildup circuitries.

The first routing circuitry 12, the semiconductor devices 13, the balance layer 17 and the heat spreader 18 are positioned within the through opening 205 of the stiffener 20. The semiconductor devices 13 are electrically coupled to the first routing circuitry 12 from the first surface 101 of the first routing circuitry 12, and are laterally surrounded by the balance layer 17 and thermally conductible to the heat spreader 18. The first routing circuitry 12 includes primary and first conductive traces 121, 125 laterally extending beyond peripheral edges of the semiconductor devices 13 and provides first level fan-out routing for the semiconductor devices 13.

The stiffener 20 surrounds peripheral edges of the first routing circuitry 12, the balance layer 17 and the heat spreader 18 and laterally extends to the peripheral edges of the semiconductor assembly 100 to provide mechanical support and suppress warping and bending of the semiconductor assembly 100.

The second routing circuitry 40 is disposed outside the through opening 205 of the stiffener 20 and electrically coupled to the first routing circuitry 12 through the second conductive vias 417 of the second routing circuitry 40 from the second surface 103 of the first routing circuitry 12. As the first routing circuitry 12 has larger pad size and pad pitch at its second surface 103 than the semiconductor devices 13, the second routing circuitry 40 can be interconnected to the first routing circuitry 12 in high manufacturing yield. The second routing circuitry 40 includes second and third conductive traces 415, 425 extending into an area outside of the through opening 205 of the stiffener 20 and laterally extending beyond peripheral edges of the first routing circuitry 12 and over the second surface 203 of the stiffener 20. As such, the second routing circuitry 40 not only provides further fan-out wiring structure for the semiconductor devices 13, but also mechanically binds the first routing circuitry 12 with the stiffener 20.

Embodiment 2

FIGS. 27-35 are schematic views showing a method of making another semiconductor assembly that includes another aspect of subassembly in accordance with the second embodiment of the present invention.

For purposes of brevity, any description in Embodiment 1 above is incorporated herein insofar as the same is applicable, and the same description need not be repeated.

Figure 27:
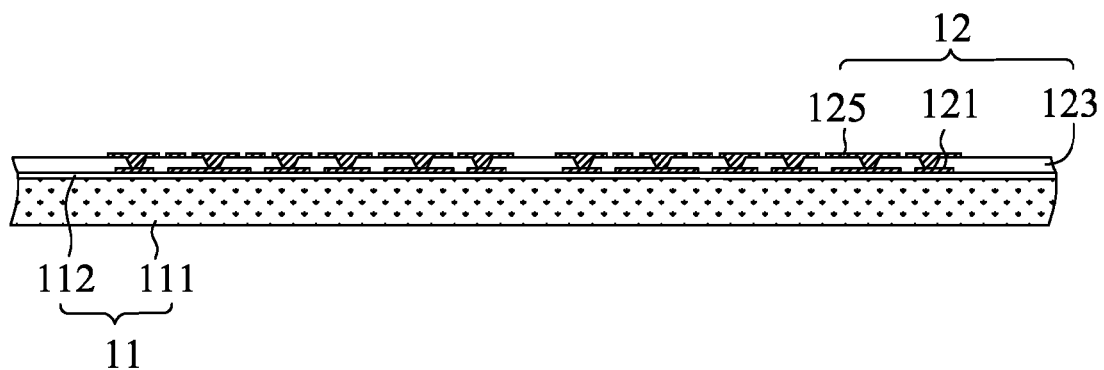
FIG. 27 is a cross-sectional view of a first routing circuitry on a sacrificial carrier in accordance with the second embodiment of the present invention.

FIG. 27 is a cross-sectional view of the structure with a first routing circuitry 12 detachably adhered over a sacrificial carrier 11. In this illustration, the sacrificial carrier 11 is a double-layer structure and includes a support sheet 111 and a barrier layer 112 deposited on the support sheet 111. The first routing circuitry 12 is the same as that illustrated in FIG. 4 and formed on the barrier layer 112. The barrier layer 112 can have a thickness of 0.001 to 0.1 mm and may be a metal layer that is inactive against chemical etching during chemical removal of the support sheet 111 and can be removed without affecting the primary conductive traces 121. For instance, the barrier layer 112 may be made of tin or nickel when the support sheet 111 and the primary conductive traces 121 are made of copper. Further, in addition to metal materials, the barrier layer 112 can also be a dielectric layer such as a peelable laminate film. In this embodiment, the support sheet 111 is a copper sheet, and the barrier layer 112 is a nickel layer of 5 microns in thickness.

Figure 28:
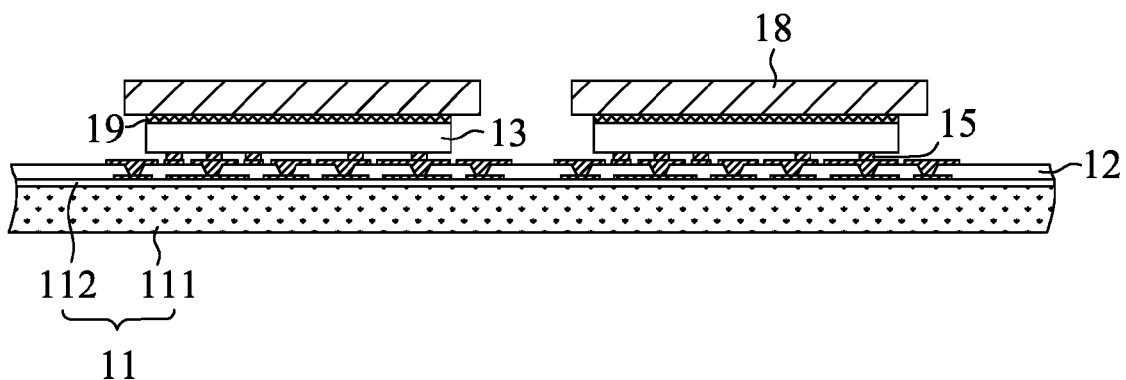
FIG. 28 is a cross-sectional view showing that the structure of FIG. 27 is provided with semiconductor devices and heat spreaders in accordance with the second embodiment of the present invention.

FIG. 28 is a cross-sectional view of the structure with semiconductor devices 13 electrically coupled to the first routing circuitry 12 and a heat spreader 18 attached to the semiconductor devices 13. The semiconductor devices 13 are electrically coupled to the first routing circuitry 12 using bumps 15. The heat spreader 18 is attached on the semiconductor devices 13 using a thermally conductive material 19.

Figure 29:
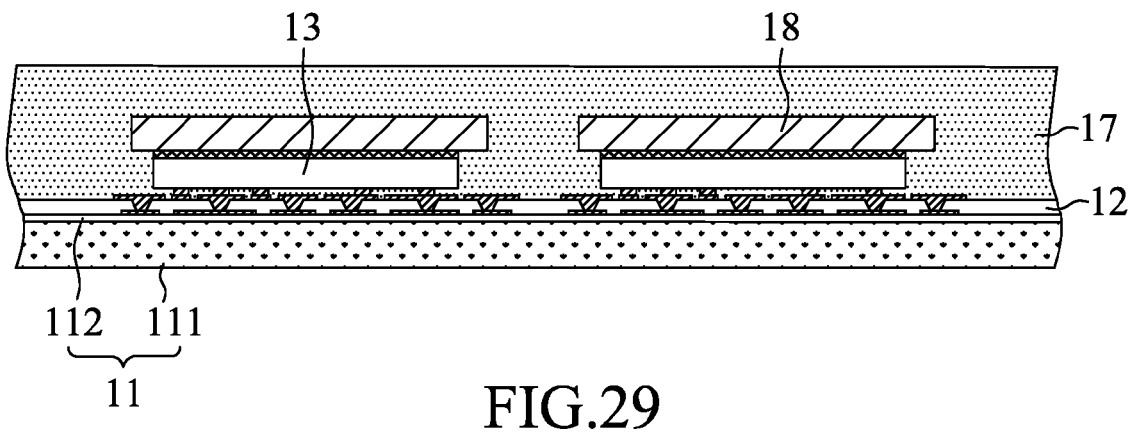
FIG. 29 is a cross-sectional view showing that the structure of FIG. 28 is provided with a balance layer in accordance with the second embodiment of the present invention.

FIG. 29 is a cross-sectional view of the structure with a balance layer 17 on the heat spreader 18 and the first routing circuitry 12. The balance layer 17 covers the heat spreader 18 and the first routing circuitry 12 from above and surrounds and conformally coats and covers sidewalls of the semiconductor devices 13 and the heat spreader 18.

Figure 30:
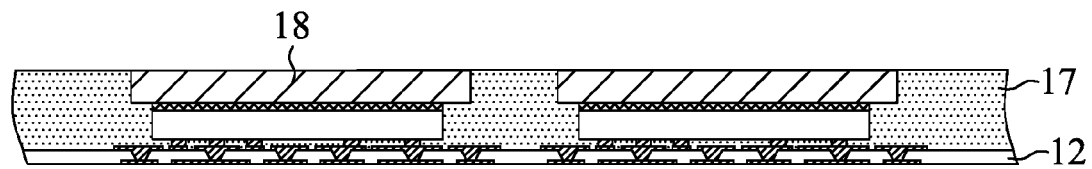
FIG. 30 is a cross-sectional view showing that a top portion of the balance layer and the sacrificial carrier are removed from the structure of FIG. 29 in accordance with the second embodiment of the present invention.

FIG. 30 is a cross-sectional view of the structure after removal of the upper portion of the balance layer 17 and the sacrificial carrier 11. The heat spreader 18 is exposed from above and substantially coplanar with the balance layer 17 at the top surfaces thereof. The first routing circuitry 12 is exposed from below by removing the support sheet 111 made of copper using an alkaline etching solution and then removing the barrier layer 112 made of nickel using an acidic etching solution. In another aspect of the barrier layer 112 being a peelable laminate film, the barrier layer 112 can be removed by mechanical peeling or plasma ashing.

Figure 31:
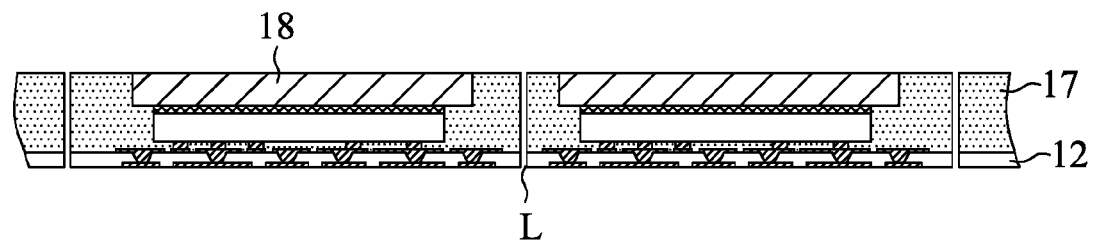
FIG. 31 is a cross-sectional view of a diced state of the panel-scale structure of FIG. 30 in accordance with the second embodiment of the present invention.

FIG. 31 is a cross-sectional view of the panel-scale structure of FIG. 30 diced into individual pieces. The panel-scale structure is singulated into individual subassembly 10 along dicing lines "L".

Figure 32:
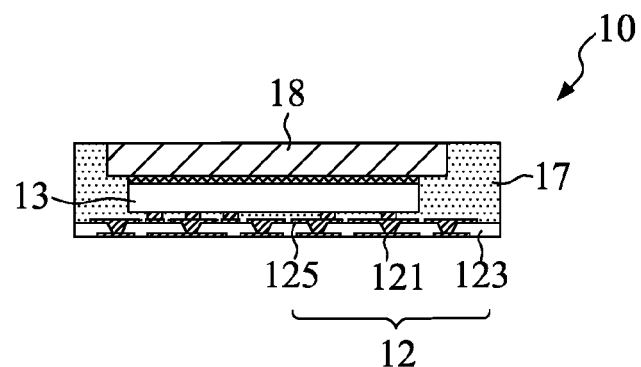
FIG. 32 is a cross-sectional view of a subassembly corresponding to a diced unit in FIG. 31 in accordance with the second embodiment of the present invention.

FIG. 32 is a cross-sectional view of an individual subassembly 10 that includes a first routing circuitry 12, a semiconductor device 13, a balance layer 17 and a heat spreader 18. The first routing circuitry 12 provides first level fan-out routing for the semiconductor device 13, whereas the heat spreader 18 provides thermal dissipation pathway for the semiconductor device 13.

Figure 33:
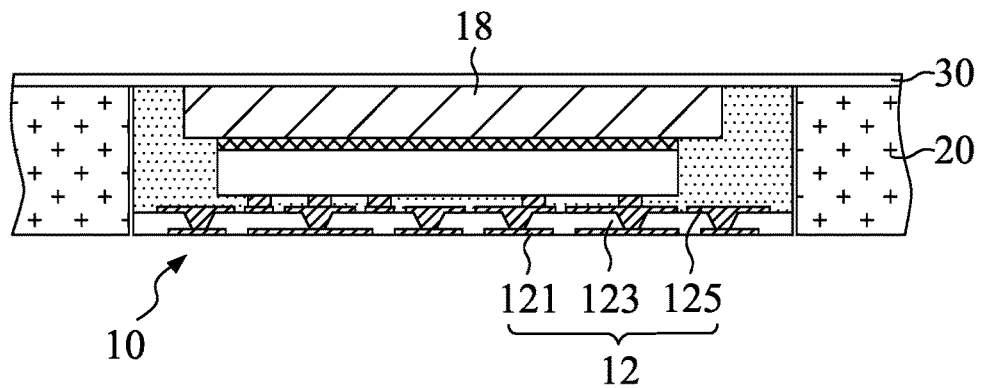
FIG. 33 is a cross-sectional view showing that the subassembly of FIG. 32 and a stiffener are attached to a carrier film in accordance with the second embodiment of the present invention.

FIG. 33 is a cross-sectional view of the structure with the subassembly 10 of FIG. 32 attached to the carrier film 30 of FIG. 16. The subassembly 10 is inserted into and steadily received within the through opening 205 of the stiffener 20 with the balance layer 17 and the heat spreader 18 attached to the carrier film 30.

Figure 34:
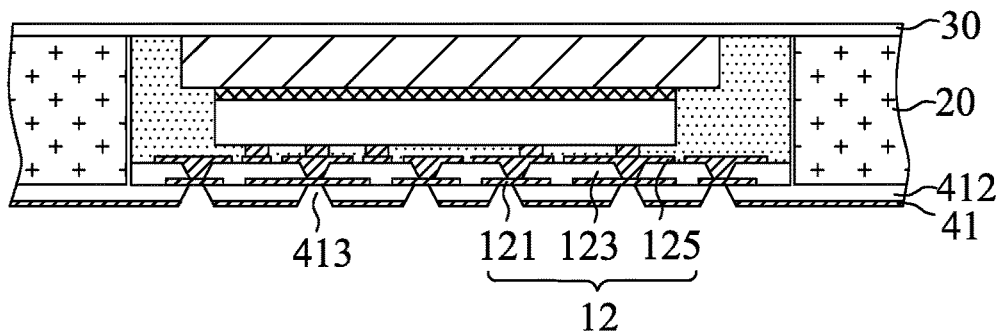
FIG. 34 is a cross-sectional view showing that the structure of FIG. 33 is provided with a second dielectric layer and a metal layer and second via openings in accordance with the second embodiment of the present invention.

FIG. 34 is a cross-sectional view of the structure with a second dielectric layer 412 and a metal layer 41 laminated/coated on the subassembly 10 and the stiffener 20 from below and second via openings 413 in the second dielectric layer 412 as well as the metal layer 41. The second dielectric layer 412 contacts and is sandwiched between the first dielectric layer 123/the primary conductive traces 121 and the metal layer 41 and between the stiffener 20 and the metal layer 41. The second via openings 413 extend through the metal layer 41 and the second dielectric layer 412 to expose selected portions of the primary conductive traces 121 from below.

Figure 35:
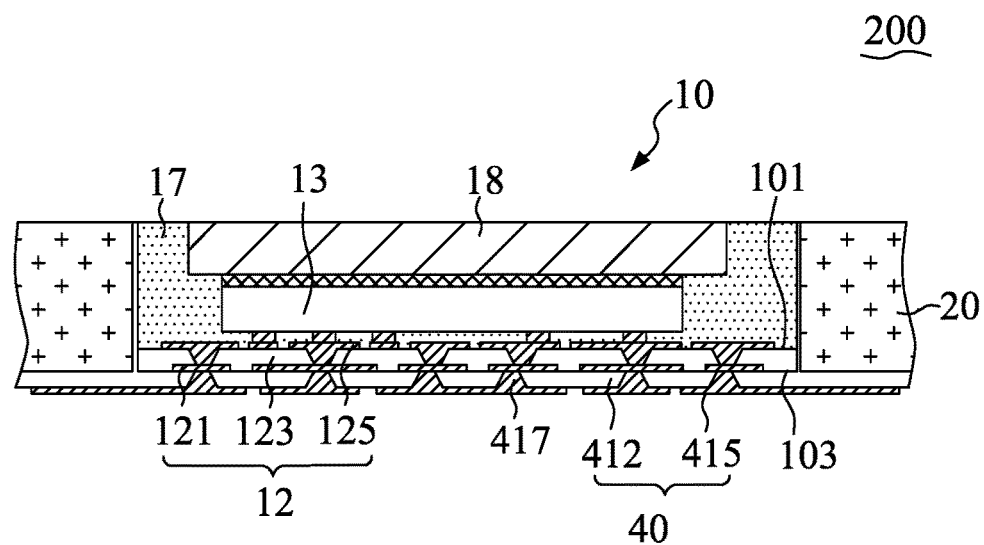
FIG. 35 is a cross-sectional view showing that the structure of FIG. 34 is provided with second conductive traces and the carrier film is removed therefrom to finish the fabrication of a semiconductor assembly in accordance with the second embodiment of the present invention.

Referring now to FIG. 35, second conductive traces 415 are formed on the second dielectric layer 412 by metal deposition and metal patterning process, and the carrier film 30 is removed therefrom to expose the heat spreader 18 from above. The second conductive traces 415 extend from the primary conductive traces 121 in the downward direction, fill up the second via openings 413 to form second conductive vias 417 in direct contact with the primary conductive traces 121, and extend laterally on the second dielectric layer 412.

Accordingly, as shown in FIG. 35, a semiconductor assembly 200 is accomplished and includes a subassembly 10, a stiffener 20 and a second routing circuitry 40. In this illustration, the second routing circuitry 40 includes a second dielectric layer 412 and second conductive traces 415.

The subassembly 10 is positioned within the through opening 205 of the stiffener 20 and includes a first routing circuitry 12, a semiconductor device 13, a balance layer 17 and a heat spreader 18. The first routing circuitry 12 has peripheral edges confined within the through opening 205 of the stiffener 20 and has larger pad size and pad pitch at its second surface 103 than at its first surface 101. As a result, the semiconductor device 13 can be assembled on the first surface 101 of the first routing circuitry 12, and the second routing circuitry 40 can be interconnected to the first routing circuitry 12 from the second surface 103 in a higher manufacturing yield. The second routing circuitry 40 is disposed outside the through opening 205 of the stiffener 20 and electrically coupled to the first routing circuitry 12 to provide further fan-out routing.

Embodiment 3

FIGS. 36-44 are schematic views showing another method of making a semiconductor assembly in which no carrier film is used and the second routing circuitry is further electrically coupled to the stiffener for ground connection in accordance with the third embodiment of the present invention.

For purposes of brevity, any description in Embodiments above is incorporated herein insofar as the same is applicable, and the same description need not be repeated.

Figure 36:
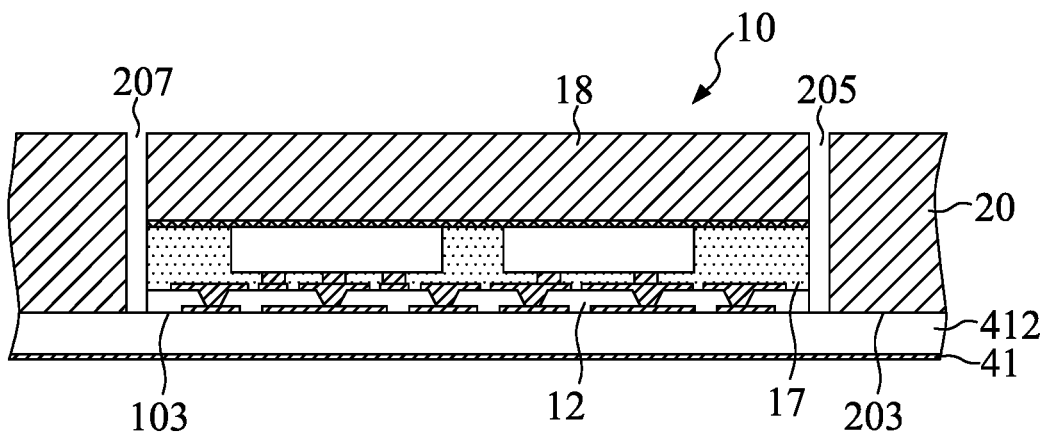
FIG. 36 is a cross-sectional view showing that the subassembly of FIG. 14 and a stiffener on a second dielectric layer/a metal layer in accordance with the third embodiment of the present invention.

FIG. 36 is a cross-sectional view of the structure with the subassembly 10 of FIG. 14 and a metallic stiffener 20 on a second dielectric layer 412/a metal layer 41. In this illustration, the second dielectric layer 412 is sandwiched between the subassembly 10 and the metal layer 41 and between the stiffener 20 and the metal layer 41, and contacts the second surface 103 of the subassembly 10 and the second surface 203 of the stiffener 20. The second surface 103 of the subassembly 10 is substantially coplanar with the second surface 203 of the stiffener 20 in the downward direction, and a gap 207 is formed in the through opening 205 between the subassembly 10 and the stiffener 20. The gap 207 is laterally surrounded by the stiffener 20, and laterally surrounds the first routing circuitry 12, the balance layer 17 and the heat spreader 18.

Figure 37:
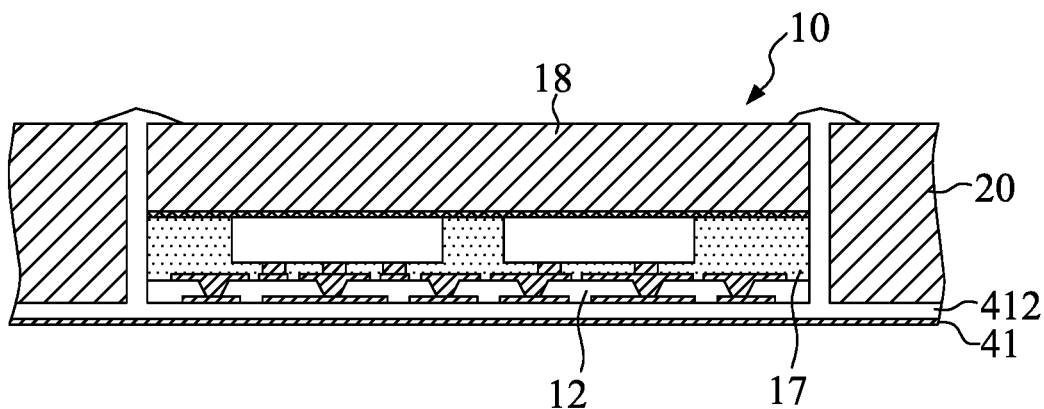
FIG. 37 is a cross-sectional view showing that the structure of FIG. 36 is subjected to a lamination process in accordance with the third embodiment of the present invention.

FIG. 37 is a cross-sectional view of the structure with the second dielectric layer 412 forced into the gap 207. The second dielectric layer 412 is flowed into the gap 207 by applying heat and pressure. Under the heat and pressure, the second dielectric layer 412 becomes compliant enough to conform to virtually any shape. As a result, the second dielectric layer 412 sandwiched between the subassembly 10 and the metal layer 41 and between the stiffener 20 and the metal layer 41 is compressed, forced out of its original shape and flows into and upward in the gap 207 to conformally coat sidewalls of the through opening 205 and peripheral edges of the first routing circuitry 12, the balance layer 17 and the heat spreader 18. The second dielectric layer 412 as solidified provides secure robust mechanical bonds between the subassembly 10 and the stiffener 20, between the subassembly 10 and the metal layer 41 and between the stiffener 20 and the metal layer 41, and thus retains the subassembly 10 within the through opening 205 of the stiffener 20. In this illustration, the second dielectric layer 412 also rises slightly above the gap 207 and overflows onto the heat spreader 18 and the stiffener 20.

Figure 38:
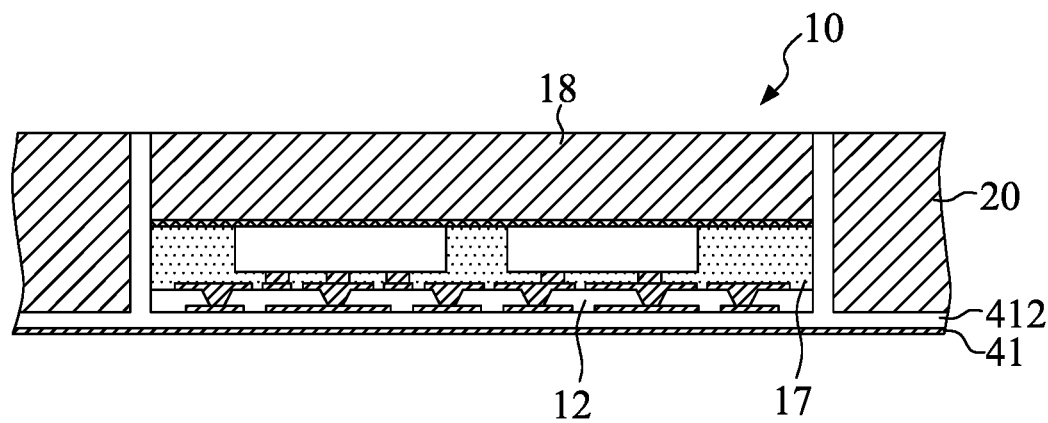
FIG. 38 is a cross-sectional view showing that an excess portion of the second dielectric layer is removed from the structure of FIG. 37 in accordance with the third embodiment of the present invention.

FIG. 38 is a cross-sectional view of the structure after removal of excess portion of the second dielectric layer 412 that overflows onto the heat spreader 18 and the stiffener 20. The excess portion of the second dielectric layer 412 can be removed by lapping/grinding.

Figure 39:
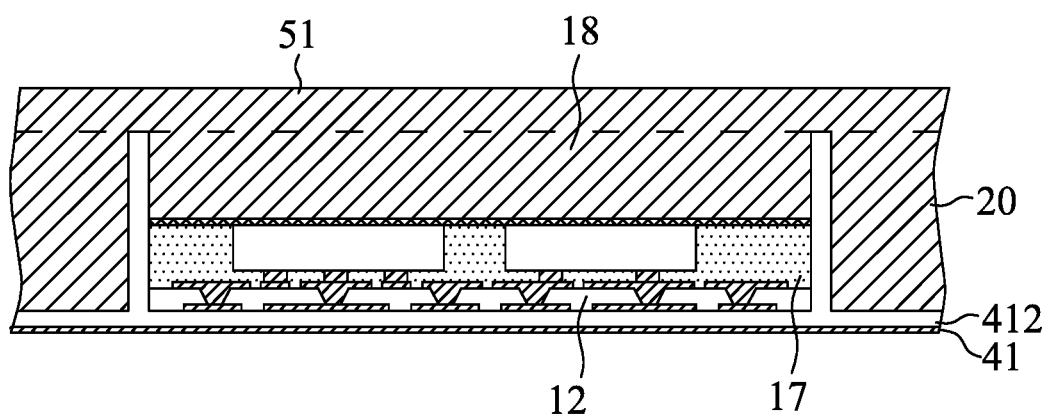
FIG. 39 is a cross-sectional view showing that the structure of FIG. 38 is provided with a thermally conductive joint layer in accordance with the third embodiment of the present invention.

FIG. 39 is a cross-sectional view of the structure provided with a thermally conductive joint layer 51. The top surface of the structure can be metallized to form the thermally conductive joint layer 51 as a single layer or multiple layers. The thermally conductive joint layer 51 is an unpatterned metal layer (typically a copper layer) that contacts the heat spreader 18, the stiffener 20 and the second dielectric layer 412 in the gap 207 and covers them from above. In the case of the heat spreader 18 and the stiffener 20 being made of metal, the thermally conductive joint layer 51 typically is deposited by an electroless plating process followed by an electrolytic plating process. In this illustration, the heat spreader 18, the stiffener 20 and the thermally conductive joint layer 51 are shown as a single layer for convenience of illustration. The boundary (shown in dashed line) between the metal layers may be difficult or impossible to detect since copper is plated on copper. However, the boundary between the thermally conductive joint layer 51 and the second dielectric layer 412 in the gap 207 is clear.

Figure 40:
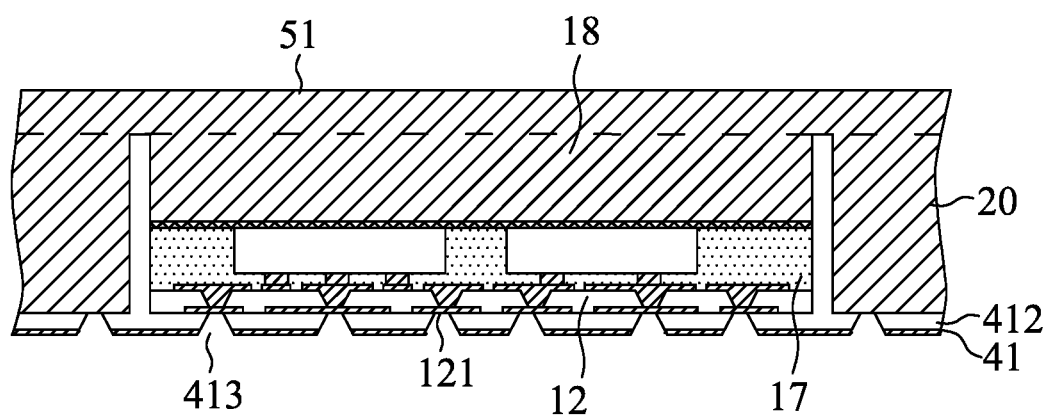
FIG. 40 is a cross-sectional view showing that the structure of FIG. 39 is provided with second via openings in accordance with the third embodiment of the present invention.

FIG. 40 is a cross-sectional view of the structure provided with the second via openings 413 to expose selected portions of the primary conductive traces 121 and the stiffener 20. The second via openings 413 extend through the metal layer 41 and the second dielectric layer 412, and are aligned with the selected portions of the primary conductive traces 121 and the stiffener 20.

Figure 41:
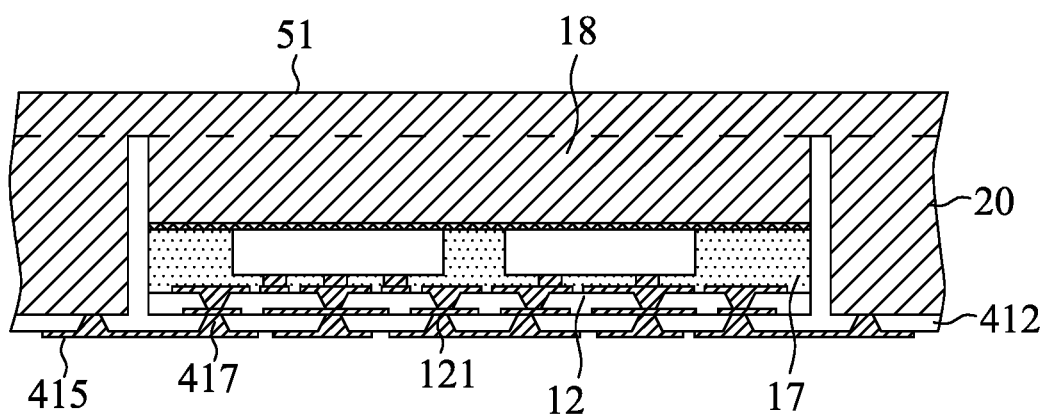
FIG. 41 is a cross-sectional view showing that the structure of FIG. 40 is provided with second conductive traces in accordance with the third embodiment of the present invention.

FIG. 41 is a cross-sectional view of the structure provided with second conductive traces 415 on the second dielectric layer 412 by metal deposition and metal patterning process. The second conductive traces 415 extend from the primary conductive traces 121 and the stiffener 20 in the downward direction, fill up the second via openings 413 to form second conductive vias 417 in direct contact with the primary conductive traces 121 and the stiffener 20, and extend laterally on the second dielectric layer 412.

Figure 42:
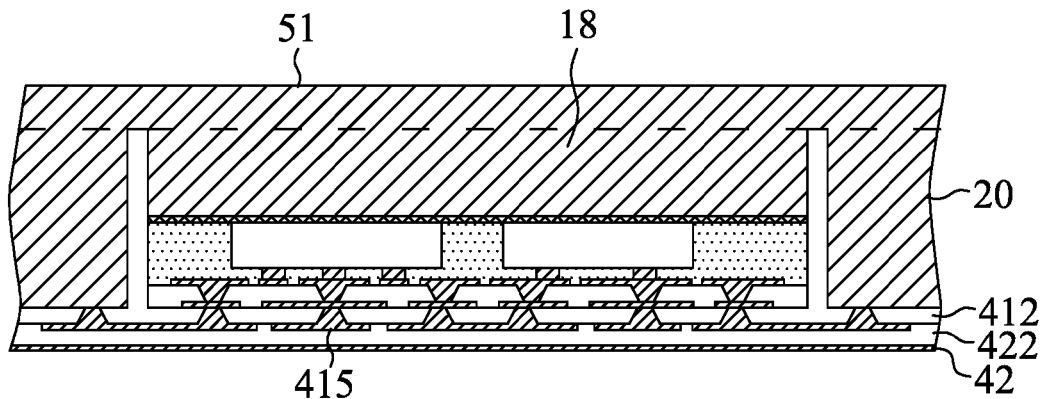
FIG. 42 is a cross-sectional view showing the structure of FIG. 41 is provided with a third dielectric layer and a metal layer in accordance with the third embodiment of the present invention.

FIG. 42 is a cross-sectional view of the structure with a third dielectric layer 422 and a metal layer 42 laminated/coated on the second dielectric layer 412 and the second conductive traces 415 from below. The third dielectric layer 422 contacts and is sandwiched between the second dielectric layer 412/the second conductive traces 415 and the metal layer 42.

Figure 43:
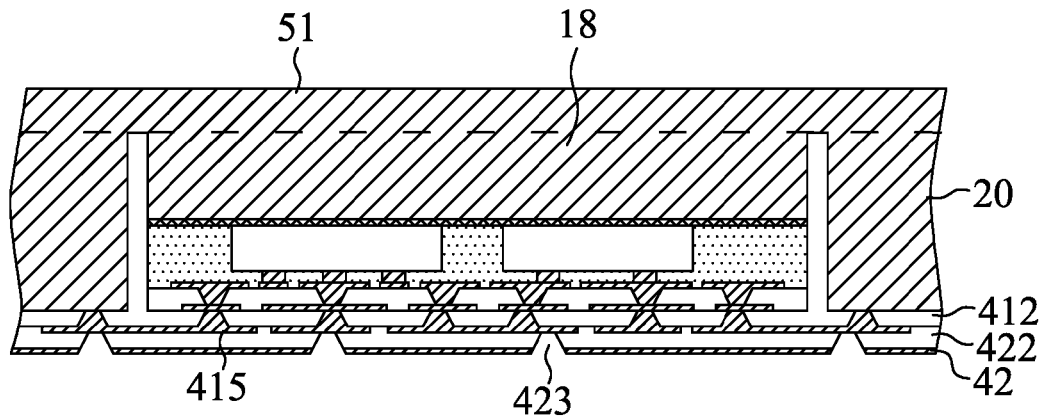
FIG. 43 is a cross-sectional view showing the structure of FIG. 42 is provided with third via openings in accordance with the third embodiment of the present invention.

FIG. 43 is a cross-sectional view of the structure provided with the third via openings 423 to expose selected portions of the second conductive traces 415. The third via openings 423 extend through the metal layer 42 and the third dielectric layer 422, and are aligned with the selected portions of the second conductive traces 415.

Figure 44:
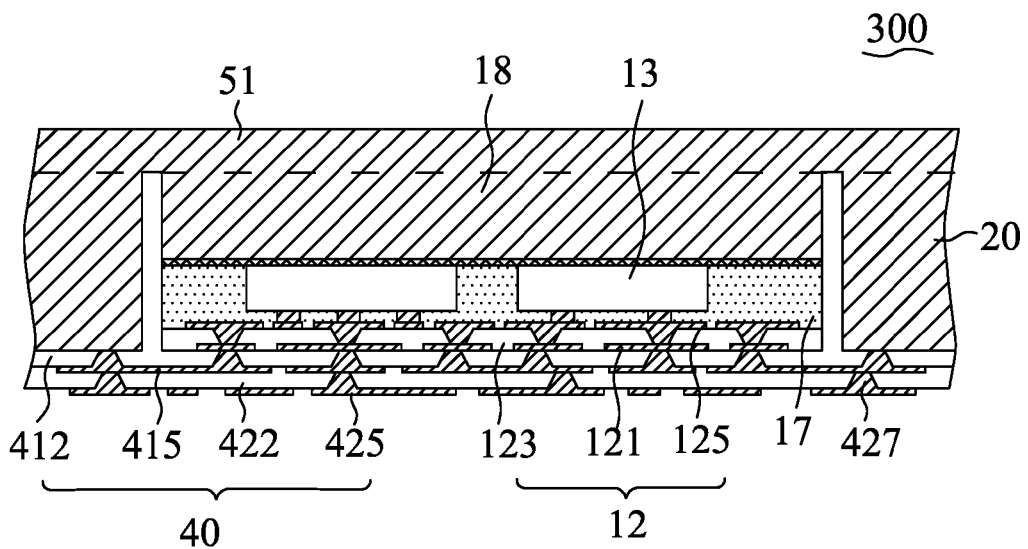
FIG. 44 is a cross-sectional view showing the structure of FIG. 43 is provided with third conductive traces to finish the fabrication of a semiconductor assembly in accordance with the third embodiment of the present invention.

FIG. 44 is a cross-sectional view of the structure provided with third conductive traces 425 on the third dielectric layer 422 by metal deposition and metal patterning process. The third conductive traces 425 extend from the second conductive traces 415 in the downward direction, fill up the third via openings 423 to form third conductive vias 427 in direct contact with the second conductive traces 415, and extend laterally on the third dielectric layer 422.

Accordingly, as shown in FIG. 44, a semiconductor assembly 300 is accomplished and includes a first routing circuitry 12, semiconductor devices 13, a balance layer 17, a heat spreader 18, a stiffener 20, a second routing circuitry 40 and a thermally conductive joint layer 51, and both first and second routing circuitries 12, 40 are sequentially formed multi-layered buildup circuitries. In this illustration, the first routing circuitry 12 includes primary conductive traces 121, a first dielectric layer 123 and first conductive traces 125, whereas the second routing circuitry 40 includes a second dielectric layer 412, second conductive traces 415, a third dielectric layer 422 and third conductive traces 425.

The first routing circuitry 12 is positioned within the through opening 205 of the stiffener 20, and provides electrical contacts for the semiconductor devices 13 laterally surrounded by the balance layer 17 and thermally conductible to the heat spreader 18. The second routing circuitry 40 extends into an area outside of the through opening 205 of the stiffener 20 and includes second conductive traces 415 electrically coupled to the primary conductive traces 121 of the first routing circuitry 12 and the stiffener 20 and laterally extending beyond peripheral edges of the first routing circuitry 12 and over the second surface 203 of the stiffener 20. The thermally conductive joint layer 51 has a selected portion laterally extending from the heat spreader 18 to the stiffener 20 to provide a large thermal dissipation surface area. The combination of the heat spreader 18, the stiffener 20 and the thermally conductive joint layer 51 provides thermal dissipation, electromagnetic shielding and moisture barrier for the semiconductor devices 13.

Embodiment 4

FIGS. 45-48 are schematic views showing a method of making another semiconductor assembly that includes another aspect of subassembly in accordance with the fourth embodiment of the present invention.

For purposes of brevity, any description in Embodiments above is incorporated herein insofar as the same is applicable, and the same description need not be repeated.

Figure 45:
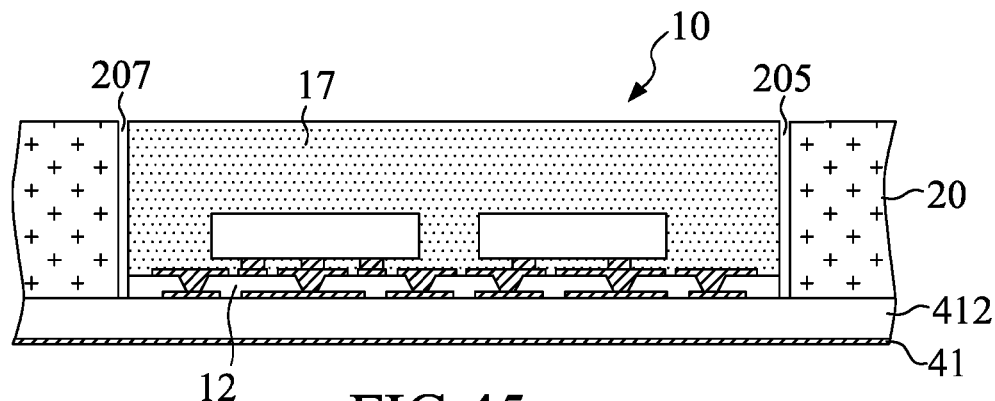
FIG. 45 is a cross-sectional view showing that a subassembly and a stiffener on a second dielectric layer/a metal layer in accordance with the fourth embodiment of the present invention.

FIG. 45 is a cross-sectional view of the structure with a subassembly 10 and a stiffener 20 on a second dielectric layer 412/a metal layer 41. The subassembly 10 can be fabricated by dicing the panel-scale structure of FIG. 8 into individual pieces, and is inserted into the through opening 205 of the stiffener 20 with a gap 207 formed between the subassembly 10 and the stiffener 20. The second dielectric layer 412 is sandwiched between the subassembly 10 and the metal layer 41 and between the stiffener 20 and the metal layer 41.

Figure 46:
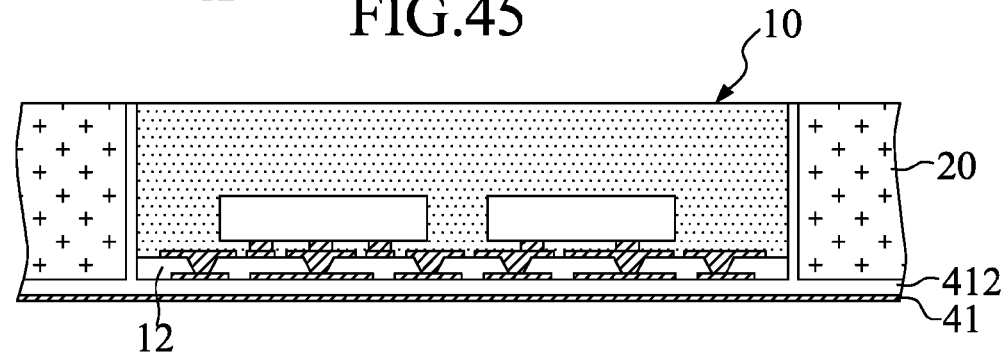
FIG. 46 is a cross-sectional view showing that the structure of FIG. 45 is subjected to a lamination process in accordance with the fourth embodiment of the present invention.

FIG. 46 is a cross-sectional view of the structure with the second dielectric layer 412 forced into the gap 207. The second dielectric layer 412 is flowed into the gap 207 and provides secure robust mechanical bonds between the subassembly 10 and the stiffener 20, between the subassembly 10 and the metal layer 41 and between the stiffener 20 and the metal layer 41.

Figure 47:
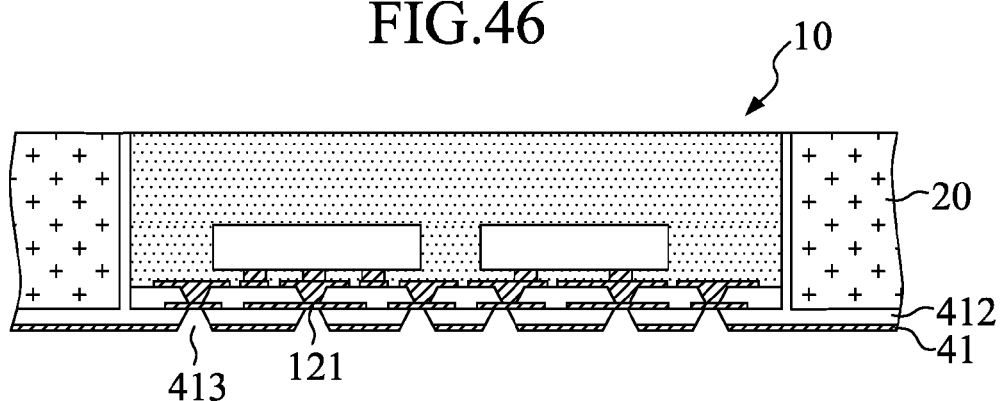
FIG. 47 is a cross-sectional view showing that the structure of FIG. 46 is provided with second via openings in accordance with the fourth embodiment of the present invention.

FIG. 47 is a cross-sectional view of the structure provided with the second via openings 413 to expose selected portions of the primary conductive traces 121. The second via openings 413 extend through the metal layer 41 and the second dielectric layer 412, and are aligned with the selected portions of the primary conductive traces 121.

Figure 48:
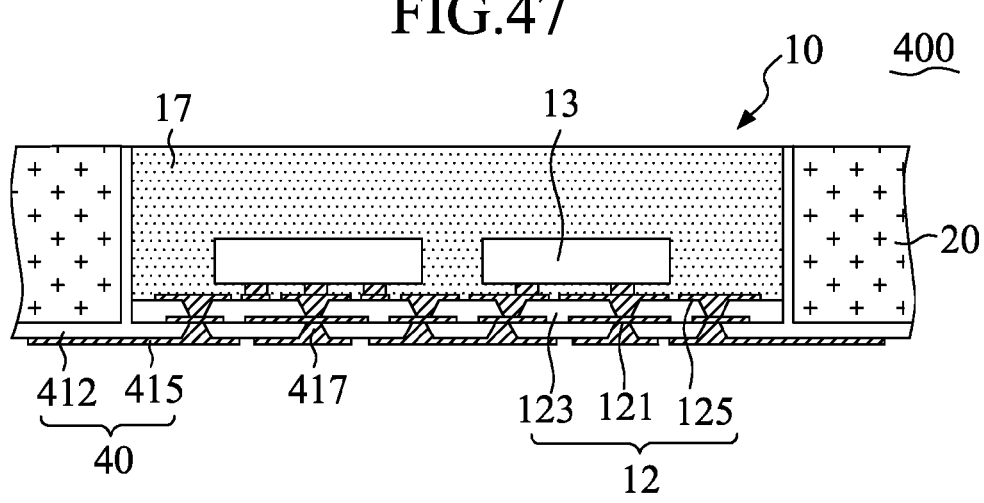
FIG. 48 is a cross-sectional view showing that the structure of FIG. 47 is provided with second conductive traces to finish the fabrication of a semiconductor assembly in accordance with the fourth embodiment of the present invention.

FIG. 48 is a cross-sectional view of the structure provided with second conductive traces 415 on the second dielectric layer 412 by metal deposition and metal patterning process. The second conductive traces 415 extend from the primary conductive traces 121 in the downward direction, fill up the second via openings 413 to form second conductive vias 417 in direct contact with the primary conductive traces 121, and extend laterally on the second dielectric layer 412.

Accordingly, as shown in FIG. 48, a semiconductor assembly 400 is accomplished and includes a first routing circuitry 12, semiconductor devices 13, a balance layer 17, a stiffener 20 and a second routing circuitry 40. In this illustration, the first routing circuitry 12 includes primary conductive traces 121, a first dielectric layer 123 and first conductive traces 125, whereas the second routing circuitry 40 includes a second dielectric layer 412 and second conductive traces 415. The first routing circuitry 12 is positioned within the through opening 205 of the stiffener 20, and provides primary fan-out routing for the semiconductor devices 13. The balance layer 17 encloses the semiconductor devices 13 and provides a high modulus anti-warping platform for the semiconductor devices 13 and the first routing circuitry 12. The stiffener 20 provides another high modulus anti-warping platform for the semiconductor devices 13 and the first routing circuitry 12 as well as the second routing circuitry 40. The second routing circuitry 40 extends into an area outside of the through opening 205 of the stiffener 20 and laterally extends beyond peripheral edges of the first routing circuitry 12 to provide further fan-out routing.

Embodiment 5

FIGS. 49-66 are schematic views showing another method of making a semiconductor assembly in which the subassembly is fabricated by another process in accordance with the fifth embodiment of the present invention.

For purposes of brevity, any description in Embodiments above is incorporated herein insofar as the same is applicable, and the same description need not be repeated.

Figure 49:
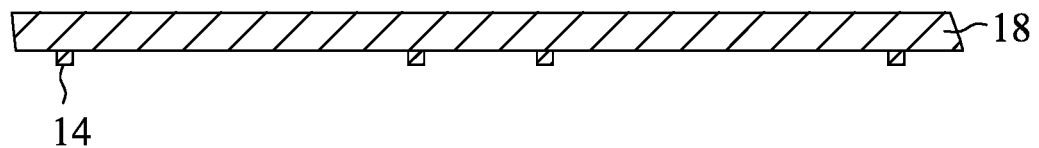
FIGS. 49 and 50 are cross-sectional and bottom perspective views, respectively, of alignment guides formed on a heat spreader in accordance with the fifth embodiment of the present invention.
Figure 50:
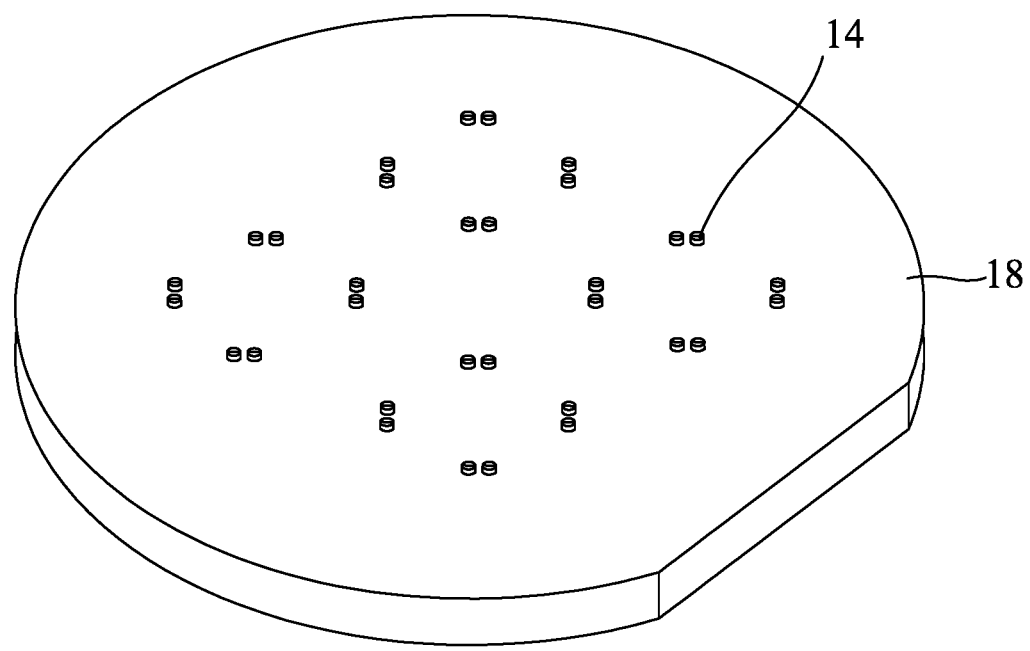

FIGS. 49 and 50 are cross-sectional and bottom perspective views, respectively, of the structure with multiple sets of alignment guides 14 on a heat spreader 18. The thickness of the heat spreader 18 preferably ranges from 0.1 to 1.0 mm. The alignment guides 14 project from the bottom surface of the heat spreader 18 and can have a thickness of 5 to 200 microns. In this embodiment, the heat spreader 18 has a thickness of 0.5 mm, whereas the alignment guides 14 have a thickness of 50 microns. For a conductive heat spreader 18, the alignment guides 14 typically are formed on the heat spreader 18 by pattern deposition of metal (such as copper), such as electroplating, electroless plating, evaporating, sputtering or their combinations using photolithographic process. Alternatively, if a non-conductive heat spreader 18 is used, a solder mask or photo resist may be used to form the alignment guides 14. As shown in FIG. 50, each set of the alignment guides 14 consists of plural posts and conform to four corners of a subsequently disposed semiconductor device. However, the alignment guide patterns are not limited thereto and can be in other various patterns against undesirable movement of the subsequently disposed semiconductor device. For instance, the alignment guide 14 may consist of a continuous or discontinuous strip and conform to four sides, two diagonal corners or four corners of a subsequently disposed semiconductor device. Alternatively, the alignment guide 14 may laterally extend to the peripheral edges of the heat spreader 18 and have inner peripheral edges that conform to the peripheral edges of a subsequently disposed semiconductor device.

Figure 51:
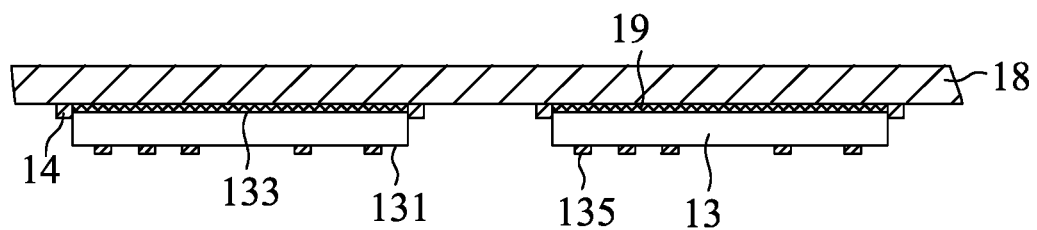
FIGS. 51 and 52 are cross-sectional and bottom perspective views, respectively, showing that semiconductor devices are attached to the heat spreader of FIGS. 49 and 50 in accordance with the fifth embodiment of the present invention.
Figure 52:
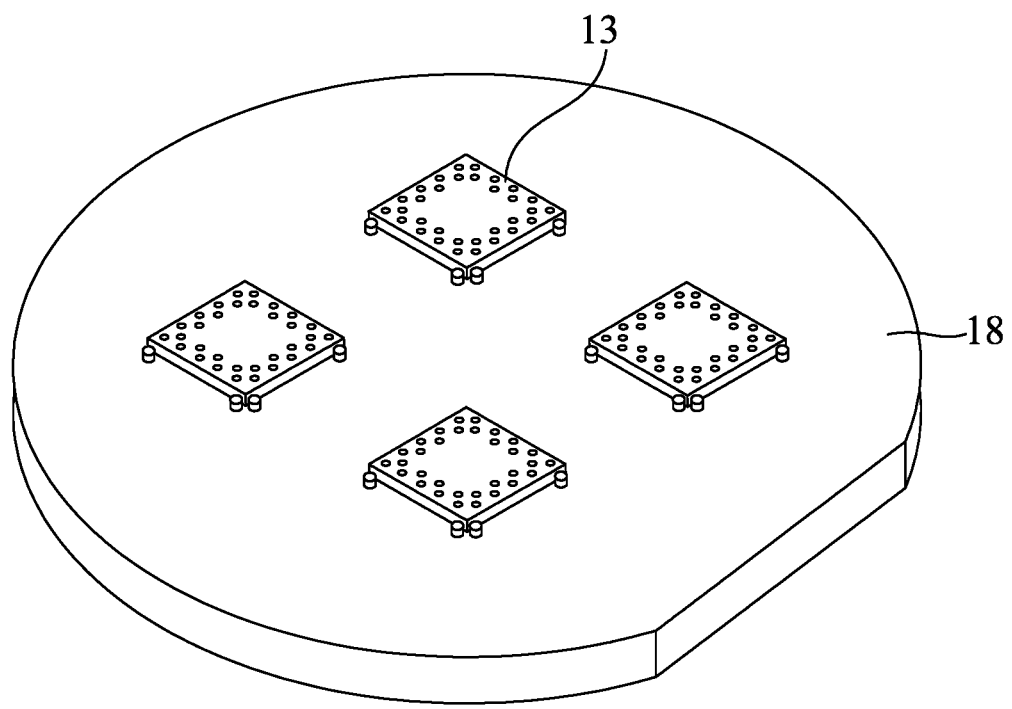

FIGS. 51 and 52 are cross-sectional and bottom perspective views, respectively, of the structure with semiconductor devices 13 attached to the heat spreader 18 using a thermally conductive material 19. Each semiconductor device 13 includes protruded bumps 135 at its active surface 131, and is attached to the heat spreader 18 with its inactive surface 133 facing the heat spreader 18. Each set of the alignment guide 14 is laterally aligned with and in close proximity to the peripheral edges of each semiconductor device 13. The device placement accuracy is provided by the alignment guides 14 that extend beyond the inactive surface 133 of the semiconductor devices 13 in the downward direction and are located beyond and laterally aligned with the four corners of the semiconductor devices 13 in the lateral directions. Because the alignment guides 14 are in close proximity to and conform to the four corners of the semiconductor devices 13 in lateral directions, any undesirable movement of the semiconductor devices 13 due to adhesive curing can be avoided. Preferably, a gap in between the alignment guides 14 and the semiconductor devices 13 is in a range of about 5 to 50 microns. Additionally, the semiconductor devices 13 also may be attached without the alignment guides 14.

Figure 53:
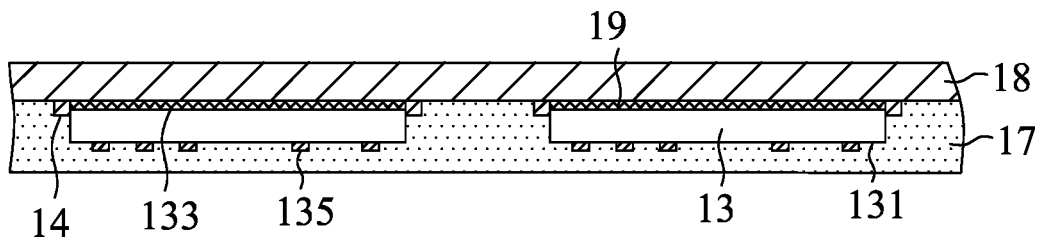
FIG. 53 is a cross-sectional view showing that the structure of FIG. 51 is provided with a balance layer in accordance with the fifth embodiment of the present invention.

FIG. 53 is a cross-sectional view of the structure provided with a balance layer 17. The balance layer 17 covers the semiconductor devices 13, the alignment guides 14 and the heat spreader 18 from below and surrounds and conformally coats and covers sidewalls of the semiconductor devices 13 and extends laterally from the semiconductor devices 13 to the peripheral edges of the structure.

Figure 54:
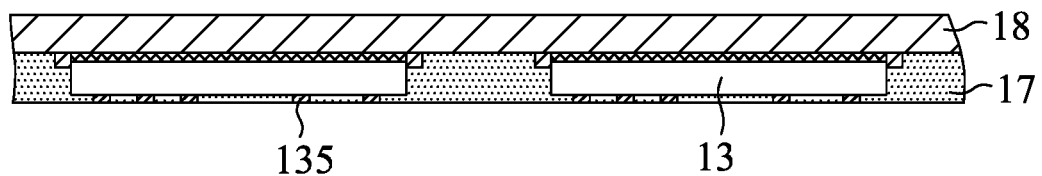
FIG. 54 is a cross-sectional view showing that a bottom portion of the balance layer is removed from the structure of FIG. 53 in accordance with the fifth embodiment of the present invention.

FIG. 54 is a cross-sectional view of the structure with the protruded bumps 135 of the semiconductor devices 13 exposed from below. After removing the lower portion of the balance layer 17, the balance layer 17 has a bottom surface substantially coplanar with the external surface of the protruded bumps 135.

Figure 55:
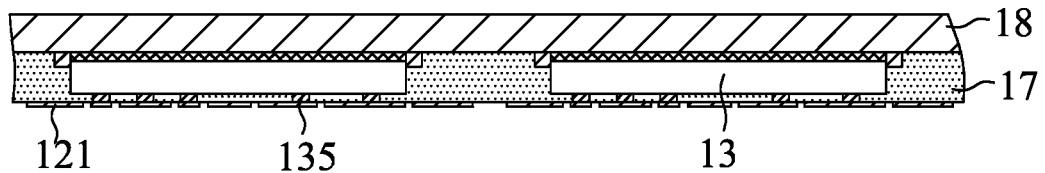
FIG. 55 is a cross-sectional view showing that the structure of FIG. 54 is provided with primary conductive traces in accordance with the fifth embodiment of the present invention.

FIG. 55 is a cross-sectional view of the structure provided with primary conductive traces 121 by metal deposition and metal patterning process. The primary conductive traces 121 extend laterally on the balance layer 17 and are electrically coupled to the protruded bumps 135 of the semiconductor devices 13.

Figure 56:
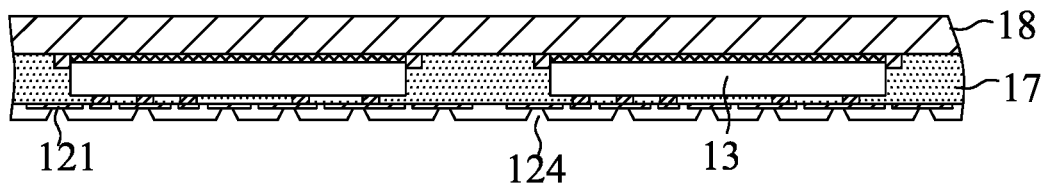
FIG. 56 is a cross-sectional view showing that the structure of FIG. 55 is provided with a first dielectric layer and first via openings in accordance with the fifth embodiment of the present invention.

FIG. 56 is a cross-sectional view of the structure with a first dielectric layer 123 laminated/coated on the primary conductive traces 121 and the balance layer 17 and first via openings 124 in the first dielectric layer 123. The first dielectric layer 123 contacts and covers and extends laterally on the primary conductive traces 121 and the balance layer 17 from below. The first via openings 124 extend through the first dielectric layer 123 and are aligned with selected portions of the primary conductive traces 121.

Figure 57:
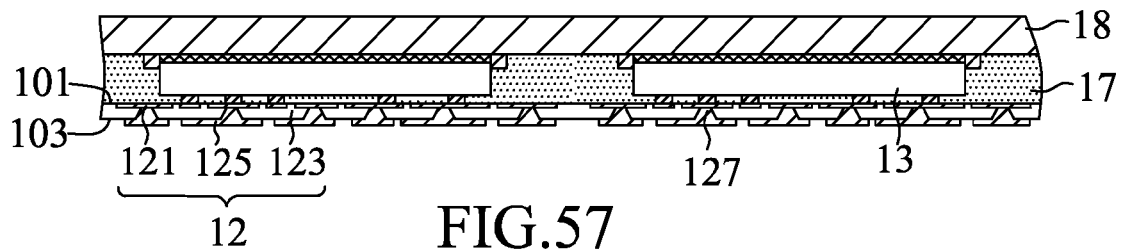
FIG. 57 is a cross-sectional view showing that the structure of FIG. 56 is provided with first conductive traces in accordance with the fifth embodiment of the present invention.

Referring now to FIG. 57, first conductive traces 125 are formed on the first dielectric layer 123 by metal deposition and metal patterning process. The first conductive traces 125 extend from the primary conductive traces 121 in the downward direction, fill up the first via openings 124 to form first conductive vias 127 in direct contact with the primary conductive traces 121, and extend laterally on the first dielectric layer 123.

At this stage, the formation of a first routing circuitry 12 on the semiconductor devices 13 and the balance layer 17 is accomplished. In this illustration, the first routing circuitry 12 includes primary conductive traces 121, a first dielectric layer 123 and first conductive traces 125. The first conductive traces 125 have larger pad size and pad pitch than those of the primary conductive traces 121 to ensure a higher manufacturing yield for the next level routing circuitry interconnected to the first conductive traces 125. As a result, the first routing circuitry 12 provides electrical contacts at its first surface 101 for chip connection and at its second surface 103 for next level routing circuitry connection.

Figure 58:
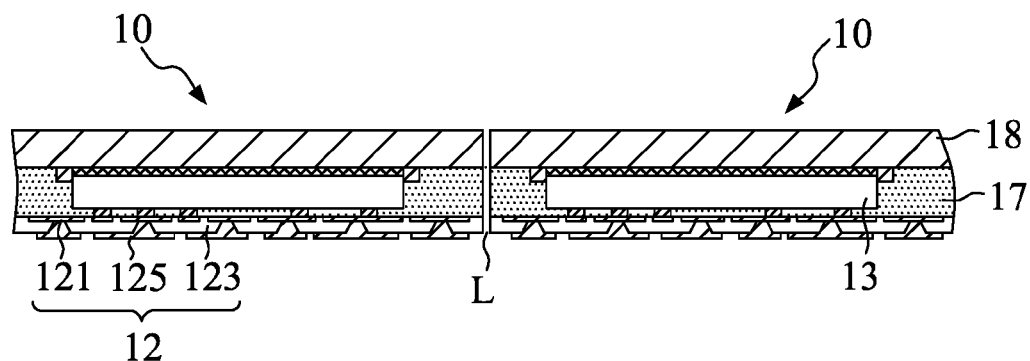
FIG. 58 is a cross-sectional view of a diced state of the panel-scale structure of FIG. 57 in accordance with the fifth embodiment of the present invention.

FIG. 58 is a cross-sectional view of the panel-scale structure of FIG. 57 diced into individual pieces. The panel-scale structure, having the first routing circuitry 12 electrically coupled to the semiconductor devices 13, is singulated into individual subassembly 10 along dicing lines "L".

Figure 59:
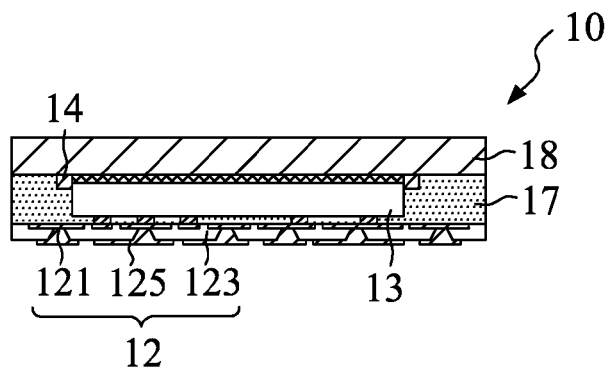
FIG. 59 is a cross-sectional view of a subassembly corresponding to a diced unit in FIG. 58 in accordance with the fifth embodiment of the present invention.

FIG. 59 is a cross-sectional view of an individual subassembly 10 that includes a first routing circuitry 12, a semiconductor device 13, an alignment guide 14, a balance layer 17 and a heat spreader 18. In this illustration, the first routing circuitry 12 is a multi-layered buildup circuitry, and includes primary conductive traces 121 and first conductive traces 125 laterally extending beyond peripheral edges of the semiconductor device 13.

Figure 60:
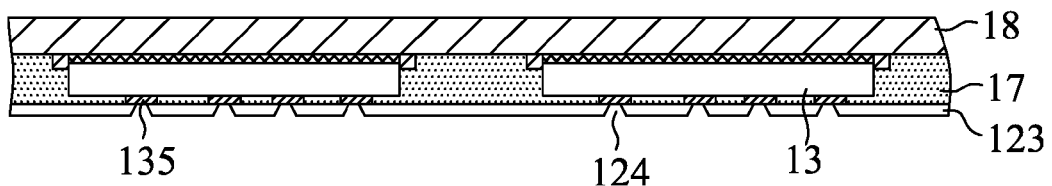
FIG. 60 is a cross-sectional view showing that the structure of FIG. 54 is provided with a first dielectric layer and first via openings in accordance with the fifth embodiment of the present invention.
Figure 61:
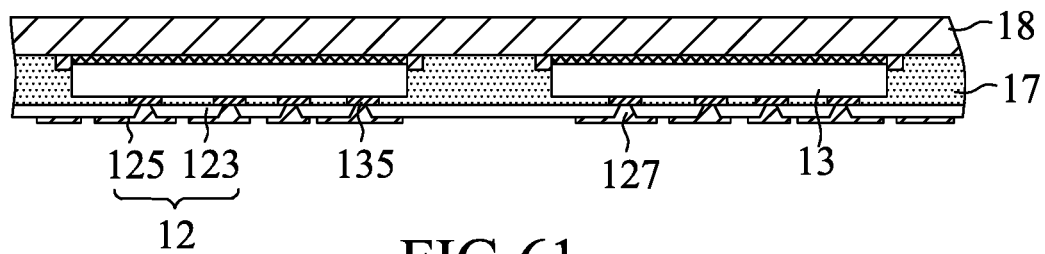
FIG. 61 is a cross-sectional view showing that the structure of FIG. 60 is provided with first conductive traces in accordance with the fifth embodiment of the present invention.
Figure 62:
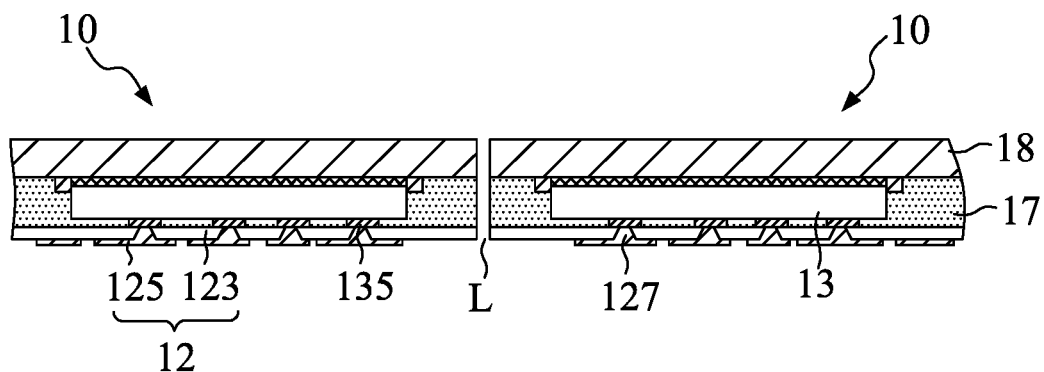
FIG. 62 is a cross-sectional view of a diced state of the panel-scale structure of FIG. 61 in accordance with the fifth embodiment of the present invention.

FIGS. 60-62 are cross-sectional views showing an alternative process of forming the subassembly 10.

FIG. 60 is a cross-sectional view of the structure with a first dielectric layer 123 laminated/coated on the semiconductor devices 13 and the balance layer 17 and first via openings 124 in the first dielectric layer 123. The first dielectric layer 123 contacts and covers and extends laterally on the protruded bumps 135 of the semiconductor devices 13 and the balance layer 17 from below. The first via openings 124 extend through the first dielectric layer 123 and are aligned with the protruded bumps 135 of the semiconductor devices 13.

FIG. 61 is a cross-sectional view of the structure provided with first conductive traces 125 on the first dielectric layer 123 by metal deposition and metal patterning process. The first conductive traces 125 extend from the protruded bumps 135 of the semiconductor devices 13 in the downward direction, fill up the first via openings 124 to form first conductive vias 127 in direct contact with the protruded bumps 135, and extend laterally on the first dielectric layer 123 to provide larger pad size and pitch than those of the semiconductor devices 13.

FIG. 62 is a cross-sectional view of the panel-scale structure of FIG. 61 diced into individual pieces. The panel-scale structure is singulated into individual subassembly 10 along dicing lines "L".

Figure 63:
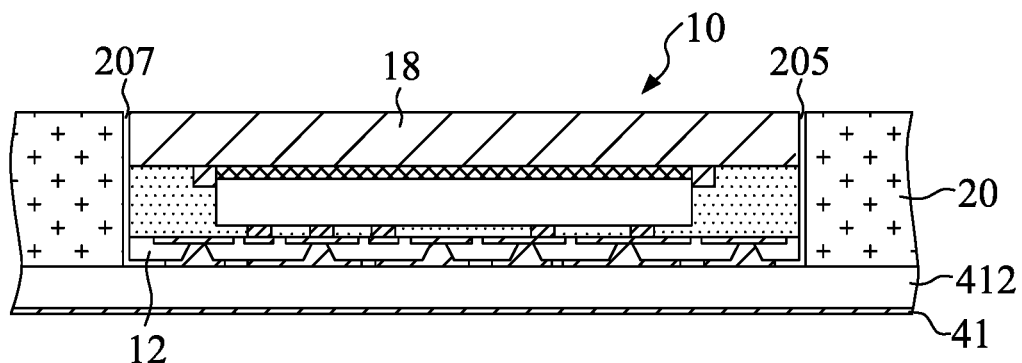
FIG. 63 is a cross-sectional view showing that the subassembly of FIG. 59 and a stiffener on a second dielectric layer/a metal layer in accordance with the fifth embodiment of the present invention.

FIG. 63 is a cross-sectional view of the structure with the subassembly 10 of FIG. 59 and a stiffener 20 on a second dielectric layer 412/a metal layer 41. The subassembly 10 is inserted into the through opening 205 of the stiffener 20 with a gap 207 formed between the subassembly 10 and the stiffener 20. The second dielectric layer 412 is sandwiched between the subassembly 10 and the metal layer 41 and between the stiffener 20 and the metal layer 41.

Figure 64:
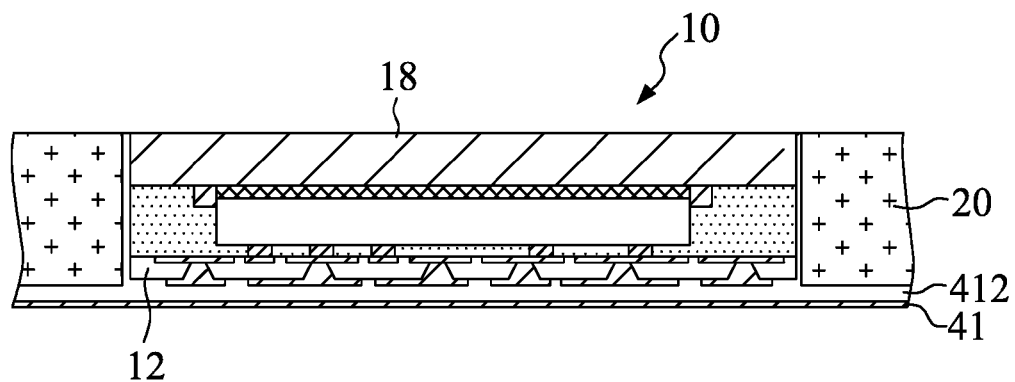
FIG. 64 is a cross-sectional view showing that the structure of FIG. 63 is subjected to a lamination process in accordance with the fifth embodiment of the present invention.

FIG. 64 is a cross-sectional view of the structure with the second dielectric layer 412 forced into the gap 207. The second dielectric layer 412 is flowed into the gap 207 and provides secure robust mechanical bonds between the subassembly 10 and the stiffener 20, between the subassembly 10 and the metal layer 41 and between the stiffener 20 and the metal layer 41.

Figure 65:
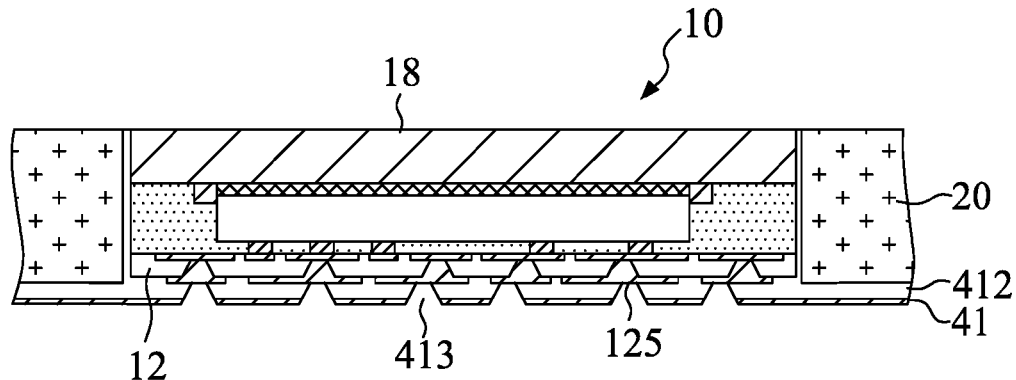
FIG. 65 is a cross-sectional view showing that the structure of FIG. 64 is provided with second via openings in accordance with the fifth embodiment of the present invention.

FIG. 65 is a cross-sectional view of the structure provided with the second via openings 413 to expose selected portions of the first conductive traces 125. The second via openings 413 extend through the metal layer 41 and the second dielectric layer 412, and are aligned with the selected portions of the first conductive traces 125.

Figure 66:
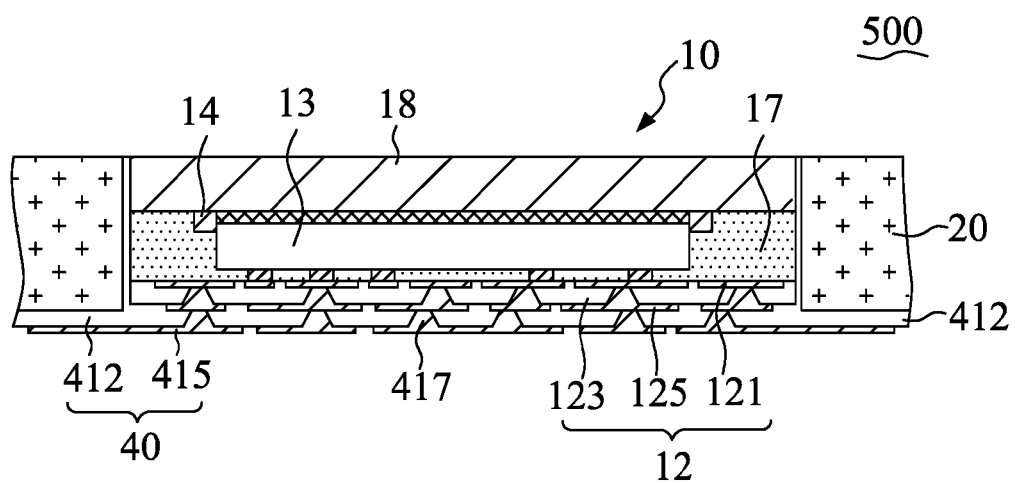
FIG. 66 is a cross-sectional view showing that the structure of FIG. 65 is provided with second conductive traces to finish the fabrication of a semiconductor assembly in accordance with the fifth embodiment of the present invention.

FIG. 66 is a cross-sectional view of the structure provided with second conductive traces 415 on the second dielectric layer 412 by metal deposition and metal patterning process. The second conductive traces 415 extend from the first conductive traces 125 in the downward direction, fill up the second via openings 413 to form second conductive vias 417 in direct contact with the first conductive traces 125, and extend laterally on the second dielectric layer 412.

Accordingly, as shown in FIG. 66, a semiconductor assembly 500 is accomplished and includes a first routing circuitry 12, a semiconductor device 13, an alignment guide 14, a balance layer 17, a heat spreader 18, a stiffener 20 and a second routing circuitry 40. In this illustration, the first routing circuitry 12 includes primary conductive traces 121, a first dielectric layer 123 and first conductive traces 125, whereas the second routing circuitry 40 includes a second dielectric layer 412 and second conductive traces 415.

The semiconductor device 13 is attached to the heat spreader 18 with the alignment guide 14 around its inactive surface 133 and conforming to its four corners. The heat spreader 18 provides thermal dissipation for the semiconductor device 13 and a high modulus anti-warping platform for the semiconductor device 13 and the first routing circuitry 12. The first routing circuitry 12 is located within the through opening 205 of the stiffener 20, and is electrically coupled to the semiconductor device 13 to provide primary fan-out routing for the semiconductor devices 13 laterally surrounded by the balance layer 17. The stiffener 20 provides another high modulus anti-warping platform for the semiconductor device 13 and the first routing circuitry 12 as well as the second routing circuitry 40. The second routing circuitry 40 extends into an area outside of the through opening 205 of the stiffener 20 and provides further fan-out routing.

The semiconductor assemblies described above are merely exemplary. Numerous other embodiments are contemplated. In addition, the embodiments described above can be mixed-and-matched with one another and with other embodiments depending on design and reliability considerations. For instance, the stiffener may include multiple through openings arranged in an array and each through opening accommodates an subassembly therein. Also, the second routing circuitry can include additional conductive traces to receive and route additional first routing circuitries.

As illustrated in the aforementioned embodiments, a distinctive semiconductor assembly is configured to exhibit improved reliability, which mainly includes a semiconductor device, a first routing circuitry, a balance layer, a stiffener and a second routing circuitry. For the convenience of following description, the direction in which the first surface of the first routing circuitry faces is defined as the first direction, and the direction in which the second surface of the first routing circuitry faces is defined as the second direction.

The semiconductor device can be a packaged or unpackaged chip. For instance, the semiconductor device can be a bare chip, or a wafer level packaged die, etc. Alternatively, the semiconductor device can be a stacked-die chip. In a preferred embodiment, the semiconductor device is electrically coupled to the first routing circuitry detachably adhered over a sacrificial carrier, followed by providing the balance layer over the first routing circuitry and then removing the sacrificial carrier to form a subassembly. In this case, the semiconductor device can be electrically coupled to the first routing circuitry using bumps with its active surface facing the first routing circuitry. The sacrificial carrier can be detached from the first routing circuitry by a chemical etching process or a mechanical peeling process after the formation of the balance layer. Preferably, the subassembly is fabricated by a panel scale process followed by a singulation process. Further, before or after the step of providing the balance layer, a heat spreader may be attached to the semiconductor device. As a result, the heat generated by the semiconductor device can be conducted away through the heat spreader. Additionally, the subassembly may be fabricated by another process that includes steps of: attaching the semiconductor device to a heat spreader, providing the balance layer over the heat spreader, and then forming the first routing circuitry over the semiconductor device and the balance layer. In this case, an alignment guide may be provided to ensure the placement accuracy of the semiconductor device on the heat spreader. Specifically, the alignment guide projects from a surface of the heat spreader, and the semiconductor device is attached to the heat spreader with the alignment guide laterally aligned with the peripheral edges of the semiconductor device. As the alignment guide extending beyond the inactive surface of the semiconductor device in the second direction and in close proximity to the peripheral edges of the semiconductor device, any undesirable movement of the semiconductor device can be avoided. As a result, a higher manufacturing yield for the first routing circuitry interconnected to the semiconductor device can be ensured.

The alignment guide can have various patterns against undesirable movement of the semiconductor device. For instance, the alignment guide can include a continuous or discontinuous strip or an array of posts. Alternatively, the alignment guide may laterally extend to the peripheral edges of the heat spreader and have inner peripheral edges that conform to the peripheral edges of the semiconductor device. Specifically, the alignment guide can be laterally aligned with four lateral surfaces of the semiconductor device to define an area with the same or similar topography as the semiconductor device and prevent the lateral displacement of the semiconductor device. For instance, the alignment guide can be aligned along and conform to four sides, two diagonal corners or four corners of the semiconductor device so as to confine the dislocation of the semiconductor device laterally. Besides, the alignment guide around the inactive surface of the semiconductor device preferably has a height in a range of 5-200 microns.

By the insertion of the subassembly into a through opening of the stiffener, the semiconductor device, the first routing circuitry, the balance layer and the optional heat spreader can be positioned within the through opening of the stiffener. In a preferred embodiment, the subassembly is inserted into the through opening of the stiffener, with peripheral edges of the first routing circuitry and the balance layer in close proximity to sidewalls of the through opening of the stiffener. Optionally, an adhesive may be dispensed in a gap formed in the through opening between the subassembly and the stiffener after the subassembly is inserted into the through opening of the stiffener, thereby providing secure robust mechanical bonds between the subassembly and the stiffener. Alternatively, the gap between the subassembly and the stiffener may be filled with a dielectric layer of the second routing circuitry. Accordingly, the sidewalls of the through opening and the peripheral edges of the subassembly can be coated with the adhesive or the dielectric layer of the second routing circuitry.

The stiffener may be a single or multi-layer structure optionally with embedded single-level conductive traces or multi-level conductive traces. In a preferred embodiment, the stiffener surrounds peripheral edges of the first routing circuitry and the balance layer and laterally extends to the peripheral edges of the semiconductor assembly. The stiffener can be made of any material which has enough mechanical robustness, such as metal, composites of metal, ceramic, resin or other non-metallic materials. Accordingly, the stiffener located around peripheral edges of the first routing circuitry and the balance layer can provide mechanical support for the semiconductor assembly to suppress warping and bending of the semiconductor assembly.

The first and second routing circuitries can be sequentially formed buildup circuitries without a core layer. The first routing circuitry laterally extends beyond the peripheral edges of the semiconductor device, and has peripheral edges confined within the through opening of the stiffener. The second routing circuitry laterally extends beyond the peripheral edges of the first routing circuitry, and can further laterally extend to peripheral edges of the semiconductor assembly to substantially have a combined surface area of the first routing circuitry and the stiffener. As such, the second routing circuitry has a larger surface area than that of the first routing circuitry. Preferably, the first and second routing circuitries are multi-layered buildup circuitries and each can include at least one dielectric layer and conductive traces that fill up via openings in the dielectric layer and extend laterally on the dielectric layer. The dielectric layer and the conductive traces are serially formed in an alternate fashion and can be in repetition when needed.

The first routing circuitry can provide fan-out routing/interconnection for the semiconductor device, and preferably has larger pad size and pad pitch at its second surface than those of the semiconductor device at its active surface. Specifically, the first routing circuitry at its second surface preferably includes conductive traces with larger pad size and pad pitch than those of the semiconductor device. For instance, the first routing circuitry can include top conductive traces at its first surface for the semiconductor device connection and bottom conductive traces at its second surface for the second routing circuitry connection. The top conductive traces can be electrically connected to the bottom conductive traces through conductive vias or inner conductive traces. In a preferred embodiment, the bottom conductive traces at the second surface have larger pad size and pad pitch than those of the top conductive traces at the first surface. Accordingly, the semiconductor device can be electrically coupled to the top conductive traces, and the second routing circuitry can be interconnected to the bottom conductive traces. As an alternative, the first routing circuitry may include conductive traces that contact and extend from the semiconductor device, fill up via openings of a dielectric layer to form conductive vias in electrical contact with the semiconductor device, and laterally extend on the dielectric layer to provide larger pad size and pad pitch than those of the semiconductor device. As the first routing circuitry has larger pad size and pad pitch at its second surface than at its first surface, micro-via connection failure in the subsequent formation of the second routing circuitry can be avoided. Additionally, the bottom conductive traces of the first routing circuitry preferably has an external surface substantially coplanar with the second surface of the stiffener and in contact with the second routing circuitry.

The second routing circuitry can be formed over the second surfaces of the first routing circuitry and the stiffener to provide further fan-out routing/interconnection after the insertion of the subassembly into the through opening of the stiffener. In a preferred embodiment, the second routing circuitry is electrically coupled to the bottom conductive traces of the first routing circuitry with larger pad size and pitch than the semiconductor device and further enlarges the pad size and pitch of the semiconductor device. As the second routing circuitry can be electrically coupled to the first routing circuitry through conductive vias of the second routing circuitry, the electrical connection between the first routing circuitry and the second routing circuitry can be devoid of soldering material. Also, the interface between the stiffener and the second routing circuitry can be devoid of solder or adhesive. More specifically, the second routing circuitry can be formed to include a dielectric layer over the second surfaces of the first routing circuitry and the stiffener, and conductive traces that extend from the bottom conductive traces of the first routing circuitry and optionally from the second surface of the stiffener and fill up via openings in the dielectric layer of the second routing circuitry and laterally extend on the dielectric layer of the second routing circuitry. As a result, the second routing circuitry can contact and be electrically coupled to the bottom conductive traces of the first routing circuitry for signal routing, and optionally further electrically coupled to the second surface of the stiffener for ground connection. The outmost conductive traces of the second routing circuitry can accommodate conductive joints, such as solder balls, for electrical communication and mechanical attachment with for the next level assembly or another electronic device.

Before the formation of the second routing circuitry, a carrier film (typically an adhesive tape) may be used to provide temporary retention force. For instance, the carrier film can temporally adhere to the first surfaces of the subassembly and the stiffener to retain the subassembly within the through opening of the stiffener, optionally followed by dispensing an adhesive in a gap between the stiffener and the subassembly, as mentioned above. After the second routing circuitry is formed over the first routing circuitry and the stiffener, the carrier film can be detached therefrom. As an alternative, the subassembly and the stiffener may be directly positioned on a dielectric layer, with the bottom conductive traces of the first routing circuitry and the second surface of the stiffener in contact with the dielectric layer, followed by bonding the dielectric layer to the first routing circuitry and the stiffener, preferably with the dielectric layer flowed into the gap between the subassembly and the stiffener. As a result, the dielectric layer can provide secure robust mechanical bonds between the subassembly and the stiffener and retain the subassembly within the through opening of the stiffener. Subsequently, the second routing circuitry, including the dielectric layer bonded to the subassembly and the stiffener, can be formed to electrically couple the first routing circuitry.

The semiconductor assembly of the present invention may further include a thermally conductive joint layer. The thermally conductive joint layer can be an unpatterned metal layer (typically a copper layer) and contact and cover the heat spreader of the subassembly and the first surface of the stiffener in the first direction. In a preferred embodiment, the thermally conductive joint layer extends to the peripheral edges of the semiconductor assembly to provide a large thermal dissipation surface area. Accordingly, the thermally conductive joint layer can provide a horizontal thermal dissipation platform that is larger than the heat spreader. In the case of the heat spreader and the stiffener being made of metal material, the thermally conductive joint layer can be deposited by an electroless plating process followed by an electrolytic plating process to achieve desired metal thickness.

The term "cover" refers to incomplete or complete coverage in a vertical and/or lateral direction. For instance, in the position that the active surface of the semiconductor device faces the downward direction, the second routing circuitry covers the semiconductor device in the downward direction regardless of whether another element such as the first routing circuitry is between the semiconductor device and the second routing circuitry.

The phrase "attached on" include contact and non-contact with a single or multiple element(s). For instance, the heat spreader is attached on the inactive surface of the semiconductor device regardless of whether it is separated from the semiconductor device by a thermally conductive material.

The phrase "aligned with" refers to relative position between elements regardless of whether elements are spaced from or adjacent to one another or one element is inserted into and extends into the other element. For instance, the alignment guide is laterally aligned with the semiconductor device since an imaginary horizontal line intersects the alignment guide and the semiconductor device, regardless of whether another element is between the alignment guide and the semiconductor device and is intersected by the line, and regardless of whether another imaginary horizontal line intersects the semiconductor device but not the alignment guide or intersects the alignment guide but not the semiconductor device. Likewise, the subassembly is aligned with the through opening of the stiffener.

The phrase "in close proximity to" refers to a gap between elements not being wider than the maximum acceptable limit. As known in the art, when the gap between the semiconductor device and the alignment guide is not narrow enough, the location error of the semiconductor device due to the lateral displacement of the semiconductor device within the gap may exceed the maximum acceptable error limit. In some cases, once the location error of the semiconductor device goes beyond the maximum limit, it is impossible to align the predetermined portion of the semiconductor device with a laser beam, resulting in the electrical connection failure between the semiconductor device and the routing circuitry. According to the contact pad size of the semiconductor device, those skilled in the art can ascertain the maximum acceptable limit for a gap between the semiconductor device and the alignment guide through trial and error to ensure the conductive vias of the routing circuitry being aligned with the I/O pads of the semiconductor device. Thereby, the description "the alignment guide is in close proximity to the peripheral edges of the semiconductor device" means that the gap between the peripheral edges of the semiconductor device and the alignment guide is narrow enough to prevent the location error of the semiconductor device from exceeding the maximum acceptable error limit. Likewise, the description "peripheral edges of the first routing circuitry, the balance layer and the heat spreader are in close proximity to sidewalls of the through opening of the stiffener" means that the gap between the peripheral edges of the first routing circuitry and the sidewalls of the through opening and between the peripheral edges of the balance layer and the sidewalls of the through opening and between the peripheral edges of the heat spreader and the sidewalls of the through opening is narrow enough to prevent the location error of the subassembly from exceeding the maximum acceptable error limit. For instance, the gaps in between the semiconductor device and the alignment guide may be in a range of about 5 to 50 microns, and the gaps in between the peripheral edges of the subassembly and the sidewalls of the through opening preferably may be in a range of about 10 to 50 microns.

The phrases "electrical connection", "electrically connected" and "electrically coupled" refer to direct and indirect electrical connection. For instance, the innermost conductive traces of the second routing circuitry directly contact and are electrically connected to the first routing circuitry, and the outmost conductive traces of the second routing circuitry are spaced from and electrically connected to the first routing circuitry by the inner conductive traces.

The "first direction" and "second direction" do not depend on the orientation of the semiconductor assembly, as will be readily apparent to those skilled in the art. For instance, the first surfaces of the first routing circuitry and the stiffener face the first direction and the second surfaces of the first routing circuitry and the stiffener face the second direction regardless of whether the semiconductor assembly is inverted. Thus, the first and second directions are opposite one another and orthogonal to the lateral directions. Furthermore, the first direction is the upward direction and the second direction is the downward direction in the position that the active surface of the semiconductor device faces the downward direction, and the first direction is the downward direction and the second direction is the upward direction in the position that the active surface of the semiconductor device faces the upward direction.

The semiconductor assembly according to the present invention has numerous advantages. For instance, the stiffener can provide an anti-warping platform for the second routing circuitry formation thereon to suppress warping and bending of the assembly. The integrated dual routing circuitries provide a staged fan-out routing/interconnection for the semiconductor device. As such, the semiconductor device with fine pads can be electrically coupled to one side of the first routing circuitry with pad size and pitch that match the semiconductor device, and the second routing circuitry is electrically coupled to the other side of the first routing circuitry with larger pad size and pitch than the semiconductor device and further enlarges the pad size and pitch of the semiconductor device. The alignment guide can provide critical placement accuracy for the semiconductor device. By the mechanical robustness of the stiffener, the warping problem can be resolved. The semiconductor assembly made by this method is reliable, inexpensive and well-suited for high volume manufacture.

The manufacturing process is highly versatile and permits a wide variety of mature electrical and mechanical connection technologies to be used in a unique and improved manner. The manufacturing process can also be performed without expensive tooling. As a result, the manufacturing process significantly enhances throughput, yield, performance and cost effectiveness compared to conventional techniques.

The embodiments described herein are exemplary and may simplify or omit elements or steps well-known to those skilled in the art to prevent obscuring the present invention. Likewise, the drawings may omit duplicative or unnecessary elements and reference labels to improve clarity.

What is claimed is:

1. A semiconductor assembly with built-in stiffener and integrated dual routing circuitries, comprising:
   a subassembly that includes a semiconductor device having an active surface and an inactive surface opposite to the active surface and separated from the active surface by a lateral surface, a balance layer, and a first routing circuitry having a first surface and a second surface opposite to the first surface, wherein (i) the active surface of the semiconductor device is electrically coupled to the first routing circuitry from the first surface of the first routing circuitry, (ii) the first routing circuitry includes at least one conductive trace laterally extending beyond peripheral edges of the semiconductor device, and (iii) the balance layer laterally surrounds the semiconductor device and covers the first surface of the first routing circuitry;

a stiffener having a first surface, a second surface opposite to the first surface, and a through opening that extends through the stiffener between the first surface and the second surface, wherein the subassembly including the first routing circuitry is entirely positioned within the through opening of the stiffener and not protruding outside the first surface and the second surface of the stiffener; and a second routing circuitry that is electrically coupled to the first routing circuitry from the second surface of the first routing circuitry and includes at least one conductive trace laterally extending beyond peripheral edges of the first routing circuitry and over the second surface of the stiffener.

2. The semiconductor assembly of claim 1, wherein the subassembly further includes a heat spreader having a first surface and a second surface opposite to the first surface, and the first surface of the heat spreader is attached to the inactive surface of the semiconductor device using a thermally conductive material.

3. The semiconductor assembly of claim 2, further comprising a thermally conductive joint layer that covers the second surface of the heat spreader and laterally extends from the heat spreader to the stiffener and covers the first surface of the stiffener.

4. The semiconductor assembly of claim 1, wherein the balance layer further covers the inactive surface of the semiconductor device.

\* \* \* \* \*